(12) United States Patent
Perego et al.

(10) Patent No.: US 8,412,906 B2
(45) Date of Patent: Apr. 2, 2013

(54) MEMORY APPARATUS SUPPORTING MULTIPLE WIDTH CONFIGURATIONS

(75) Inventors: Richard E. Perego, Thornton, CO (US); Donald C. Stark, Palo Alto, CA (US); Frederick A. Ware, Los Altos Hills, CA (US); Ely K. Tsern, Los Altos, CA (US); Craig E. Hampel, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/365,890

(22) Filed: Feb. 3, 2012

(65) Prior Publication Data

US 2012/0134084 A1     May 31, 2012

Related U.S. Application Data

(63) Continuation of application No. 12/631,614, filed on Dec. 4, 2009, now Pat. No. 8,112,608, which is a continuation of application No. 11/078,872, filed on Mar. 12, 2005, now abandoned, which is a continuation of application No. 10/302,420, filed on (Continued)

(51) Int. Cl.
*G06F 12/00* (2006.01)
*G06F 13/00* (2006.01)

(52) U.S. Cl. .............. 711/170; 711/5; 711/115

(58) Field of Classification Search .............. 711/5, 115, 711/170
See application file for complete search history.

(56) References Cited

U.S. PATENT DOCUMENTS

| | | | |
|---|---|---|---|
| 4,636,982 A | 1/1987 | Takemae et al. | 365/149 |
| 4,670,745 A | 6/1987 | O'Malley et al. | 340/801 |
| 4,766,538 A | 8/1988 | Miyoshi | 364/200 |
| 4,768,157 A | 8/1988 | Chauvel et al. | 364/521 |
| 4,837,465 A | 6/1989 | Rubinstein | 307/530 |
| 4,985,867 A | 1/1991 | Ishii et al. | 365/221 |
| 5,146,592 A | 9/1992 | Pfeiffer et al. | 395/157 |
| 5,222,047 A | 6/1993 | Matsuda et al. | 365/230.03 |
| 5,307,469 A | 4/1994 | Mann | 395/425 |
| 5,334,962 A | 8/1994 | Higgins et al. | 333/247 |
| 5,394,528 A | 2/1995 | Kobayashi et al. | 395/325 |
| 5,530,814 A | 6/1996 | Wong et al. | 395/312 |
| 5,546,346 A | 8/1996 | Agata et al. | 365/203 |
| 5,559,970 A | 9/1996 | Sharma | 395/312 |
| 5,614,855 A | 3/1997 | Lee | 327/158 |
| 5,630,106 A | 5/1997 | Ishibashi | 345/533 |

(Continued)

FOREIGN PATENT DOCUMENTS

| | | |
|---|---|---|
| EP | 0887737 A2 | 12/1998 |
| EP | 1248267 A | 10/2002 |

(Continued)

OTHER PUBLICATIONS

John, Lizy Kurian, "VaWiRAM: A Variable Width Random Access Memory Module," 1995 IEEE, 9th International Conference on VLSI Design—1996. pp. 219-224.

(Continued)

*Primary Examiner* — Midys Rojas
(74) *Attorney, Agent, or Firm* — Silicon Edge Law Group LLP; Arthur J. Behiel

(57) ABSTRACT

Described are memory apparatus organized in memory sub-sections and including configurable routing to support multiple data-width configurations. Relatively narrow width configurations load fewer sense amplifiers, resulting in reduced power usage for relatively narrow memory configurations. Also described are memory controllers that convey width selection information to configurable memory apparatus and support point-to-point data interfaces for multiple width configurations.

20 Claims, 15 Drawing Sheets

Related U.S. Application Data

Nov. 22, 2002, now Pat. No. 6,889,304, which is a continuation-in-part of application No. 12/538,613, filed on Aug. 10, 2009, which is a continuation of application No. 09/797,099, filed on Feb. 28, 2001, now Pat. No. 7,610,447.

(60) Provisional application No. 60/392,098, filed on Jun. 26, 2002.

(56) References Cited

U.S. PATENT DOCUMENTS

| | | | |
|---|---|---|---|
| 5,652,870 A | 7/1997 | Yamasaki et al. | 395/500 |
| 5,655,113 A | 8/1997 | Leung et al. | 395/552 |
| 5,717,871 A | 2/1998 | Hsieh et al. | 395/250 |
| 5,717,901 A | 2/1998 | Sung et al. | 395/497.01 |
| 5,748,561 A | 5/1998 | Hotta | 365/238.5 |
| 5,751,657 A | 5/1998 | Hotta | 365/238.5 |
| 5,764,490 A | 6/1998 | Barbier et al. | 361/823 |
| 5,764,590 A | 6/1998 | Iwamoto et al. | 365/233 |
| 5,787,267 A | 7/1998 | Leung et al. | 395/482 |
| 5,787,464 A | 7/1998 | Yoshizawa et al. | 711/115 |
| 5,793,998 A | 8/1998 | Copeland et al. | 395/201 |
| 5,798,998 A | 8/1998 | Fukushima et al. | 369/30.9 |
| 5,801,985 A | 9/1998 | Roohparvar et al. | 365/185.01 |
| 5,831,925 A | 11/1998 | Brown et al. | 365/230.03 |
| 5,852,640 A | 12/1998 | Kliza et al. | 375/356 |
| 5,852,725 A | 12/1998 | Yen | 395/830 |
| 5,893,924 A | 4/1999 | Vakkalagadda | 711/165 |
| 5,893,927 A | 4/1999 | Hovis | 711/171 |
| 5,933,387 A | 8/1999 | Worley | 365/230.03 |
| 5,936,885 A | 8/1999 | Morita | 365/185.09 |
| 5,958,033 A | 9/1999 | Schubert et al. | 710/126 |
| 5,995,379 A | 11/1999 | Kyougoku et al. | 361/803 |
| 6,034,878 A | 3/2000 | Osaka et al. | 365/52 |
| 6,038,132 A | 3/2000 | Tokunaga et al. | 361/760 |
| 6,047,347 A | 4/2000 | Hansen et al. | 710/107 |
| 6,064,585 A | 5/2000 | Mori et al. | 365/63 |
| 6,125,157 A | 9/2000 | Donnelly | 375/371 |
| 6,138,185 A | 10/2000 | Nelson et al. | 710/33 |
| 6,138,204 A | 10/2000 | Amon et al. | 711/104 |
| 6,141,273 A | 10/2000 | Ku et al. | 365/201 |
| 6,144,220 A | 11/2000 | Young et al. | 326/41 |
| 6,144,576 A | 11/2000 | Leddige et al. | 365/63 |
| 6,144,577 A | 11/2000 | Hidaka | 365/63 |
| 6,188,595 B1 | 2/2001 | Chevallier | 365/51 |
| 6,191,998 B1 | 2/2001 | Reddy et al. | 365/230.05 |
| 6,214,645 B1 | 4/2001 | Kim | 438/110 |
| 6,219,785 B1 | 4/2001 | Smith | 713/1 |
| 6,240,039 B1 | 5/2001 | Lee et al. | 365/230.06 |
| 6,247,084 B1 | 6/2001 | Apostol et al. | 710/104 |
| RE37,409 E | 10/2001 | Richardson et al. | 365/230.03 |
| 6,307,256 B1 | 10/2001 | Chiang | 257/668 |
| 6,307,769 B1 | 10/2001 | Nuxoll et al. | 365/63 |
| 6,311,313 B1 | 10/2001 | Camporese et al. | 716/6 |
| 6,366,995 B1 | 4/2002 | Vilkov et al. | 711/206 |
| 6,393,543 B1 | 5/2002 | Vilkov et al. | 711/202 |
| 6,404,660 B1 | 6/2002 | Gamini | 365/51 |
| 6,496,400 B2 | 12/2002 | Chevallier | 365/51 |
| 6,519,669 B1 | 2/2003 | Yanagisawa | 710/304 |
| 6,594,818 B2 | 7/2003 | Kim et al. | 716/19 |
| 6,625,687 B1 | 9/2003 | Halbert et al. | 711/105 |
| 6,742,098 B1 | 5/2004 | Halbert et al. | 711/172 |
| 6,754,120 B1 | 6/2004 | Bellows | 365/205 |
| 6,762,948 B2 | 7/2004 | Kyun et al. | 365/51 |
| 6,825,841 B2 | 11/2004 | Hampel et al. | 345/519 |
| 6,889,304 B2 | 5/2005 | Perego | 711/170 |
| 6,922,359 B2 | 7/2005 | Ooishi | 365/185.16 |
| 7,577,789 B2 | 8/2009 | Perego | 711/115 |
| 7,751,480 B2 | 7/2010 | Yavits et al. | 375/240.12 |
| 2001/0016369 A1 | 8/2001 | Zandman | 438/106 |
| 2001/0035862 A1 | 11/2001 | Nakamura et al. | 345/204 |
| 2001/0037428 A1 | 11/2001 | Hsu | 711/105 |
| 2002/0031035 A1 | 3/2002 | Tsuji et al. | 365/230.03 |
| 2002/0053010 A1 | 5/2002 | Piccirillo et al. | 711/170 |
| 2002/0161962 A1 | 10/2002 | Furuyama et al. | 711/103 |
| 2003/0052885 A1 | 3/2003 | Hampel | 345/501 |
| 2003/0112675 A1 | 6/2003 | Mukai et al. | 365/200 |
| 2003/0120836 A1 | 6/2003 | Gordon | 710/22 |
| 2003/0174573 A1 | 9/2003 | Suzuki et al. | 365/230.03 |
| 2004/0019756 A1 | 1/2004 | Perego | 711/170 |
| 2004/0120197 A1 | 6/2004 | Kondo et al. | 365/202 |
| 2004/0221106 A1 | 11/2004 | Perego | 711/115 |
| 2005/0028204 A1 | 2/2005 | Nakamura et al. | 725/45 |

FOREIGN PATENT DOCUMENTS

| | | |
|---|---|---|
| GB | 2367400 A | 4/2002 |
| JP | 11-306796 | 11/1999 |
| WO | WO 91-16680 | 10/1991 |
| WO | WO9941667 A1 | 8/1999 |
| WO | WO 0158035 | 8/2001 |
| WO | WO 2004/111856 | 12/2004 |

OTHER PUBLICATIONS

Yoo et al., "17.7: A 1.8V 700Mb/s/pin 512Mb DDR-II SDRAM with On-Die Termination and Off-Chip Driver Calibration", ISSCC, Feb. 2003, pp. 312-313/495/250-251.

Ware, Frederick A., Rambus, Inc., "Direct RDRAM 256/288-Mbit (512Kx16/18x32s) Data Sheet," Preliminary Information, Document DL0060 Version 0.90, 1999, pp. 1-66.

NVIDIA Corporation, Technical Brief, "GeForce3: Lightspeed Memory Architecture," pp. 1-9.

Zhao, Cansang, TA 11.6 "An 18Mb, 12.3GB/s CMOS Pipeline-Burst Cache SRAM with 1.54Gb/pin," Zhao, et al. IEEE International Solid-State Circuits Conference, 1999. 10 pages.

"The Authoritative Dictionary of IEEE Standards Terms," Copyright 2000, IEEE Press, Seventh Edition, p. 252.

Satoh et al., "A 209K-Transistor ECL Gate Array with RAM," IEEE Journal of Solid-State Circuits, vol. 24, No. 5, Oct. 1989, pp. 1275-1281.

"Memory CMOS 8 × 256K × 32 Bit Double Data Rate FCRAM, MB81N643289-50/-60," pp. 1-56, Fujitsu Semiconductor Data Sheet, Advance Info., AEO.5E.

Micron, "Graphics DDR3 DRAM." Advance. "256 Mb x 32 GDDR3 DRAM." © 2003 Micron Technology, Inc. pp. 1-67. 67 pages.

"Design Optimization Techniques for Double Data Rate SDRAM Modules," Fairchild Semiconductor, Jul. 2000, 6 pages.

Masumoto, Rodney T., "Configurable On-Chip RAM Incorporated Into High Speed Logic Array," Proceedings of the IEEE 1985 Custom Integrated Circuits Conference, May 20-23, 1985, pp. 240-243.

International Search Report and Written Opinion of the International Searching Authority in International Application PCT/US2005/032770, World Intellectual Property Organization, Jan. 26, 2006, 12 pages.

"DRAM Data Book," Micron Technology, Inc. Preliminary 1997. 3 pgs. Cover/copyright info./listing of chapters, i-xxiv, 2 pages, 1-1 to 1-44. 71 pages.

Takase, Satoru and Kushiyama, Natsuki, "A 1.6-Gbyte/s DRAM with Flexible Mapping Redundancy Technique and Additional Refresh Scheme," IEEE Journal of Solid-State Circuits, vol. 34, No. 11, Nov. 1999, pp. 1600-1606.

Samsung Electronics, "SDRAM Device Operations", date unknown.

International Search Report and Written Opinion of the International Searching Authority in International Application PCT/US2005/028728, World Intellectual Property Organization, Dec. 23, 2005.

Kirihata et al., "A 390-mm2, 16-Bank, 1-Gb DDR SDRAM with Hybrid Bitline Architecture," IEEE Journal of Solid-State Circuits, vol. 34, No. 11, Nov. 1999, pp. 1580-1588.

Minutes of Meeting No. 70, JC-42.3 Committee on RAM Memories, Mar. 9, 1994, Orlando, Florida, 72 pages (see, in particular, p. 62).

Micron Technology Inc., "Micron Synchronous DRAM 128Mb:x32 SDRAM," pp. 1-52, Rev. 9/00.

Rynearson, John "VMEbus Daisy Chains." Reprinted from the VITA Journal, Originally written in Mar. 1997, last page of article updated Sep. 15, 1999. 2 pages.

Microsoft Computer Dictionary, Copyright 1999, Fourth Edition, p. 145.

Takase, Satoro and Kushiyama, Natsuki, "WP 24.1 a 1.6GB/s DRAM with Flexible Mapping Redundancy Technique and Additional Refresh Scheme," IEEE International Solid-State Circuits Conference, 4 pages plus ISSCC Slide Supplement pp. 348-349 and 506-507, 1999.

"Rambus Dynamic Point-to-Point Named Innovation of the Year by EDN Magazine; Ground-Breaking Memory Technology Recognized in Digital SOC/IP Category", Apr. 4, 2006; downloaded from www.thefreelibrary.com, published in Business Wire. 2 pages.

EDN Innovation is a webpage describing how EDN Magazine chooses winners for EDN Innovation Awards, the web page is from www.edn.com. 2 pages (1 blank).

EDN Magazine article that describes Dynamic Point-to-Point (DPP) technology, Innovation of the Year Award. 3 pages.

Perego, Richard, U.S. Appl. No. 12/631,614, filed Dec. 4, 2009 re Office Action with mail date of Jul. 8, 2010. 14 Pages.

Perego, Richard, U.S. Appl. No. 12/631,614, filed Dec. 4, 2009 re Information Disclosure Statement submitted Sep. 20, 2010. 4 Pages.

Perego, Richard, U.S. Appl. No. 12/631,614, filed Dec. 4, 2009 re Amendment Response to Office Action submitted Jul. 8, 2010. 12 Pages.

Perego, Richard, U.S. Appl. No. 12/631,614, filed Dec. 4, 2009 re Office Action with mail date of Jan. 3, 2011. 16 Pages.

Perego, Richard, U.S. Appl. No. 12/631,614, filed Dec. 4, 2009 re Response dated Apr. 4, 2011 to the Office Action of Jan. 3, 2011. 12 Pages.

EP Extended Search Report dated May 3, 2011 re EP Application No. 10190837.4. 7 Pages.

EP Extended Search Report dated May 3, 2011 re EP Application No. 10190843.2. 6 Pages.

Final Office Action dated Jun. 22, 2011 re U.S. Appl. No. 12/631,614. 14 Pages.

Perego, Richard, U.S. Appl. No. 12/631,614, filed Dec. 4, 2009 re Response submitted Aug. 12, 2011 to the Final Office Action of Jun. 22, 2011. 3 Pages.

Perego, Richard, U.S. Appl. No. 12/631,614, filed Dec. 4, 2009 re Notice of Allowance and Fee(s) Due dated Sep. 1, 2011. 8 Pages.

Perego, Richard, U.S. Appl. No. 12/631,614, filed Dec. 4, 2009 re Information Disclosure Statement submitted Sep. 23, 2011 includes Request for Continued Examination. 4 Pages.

Perego, Richard re U.S. Appl. No. 12/631,614, filed Dec. 4, 2009 re Notice of Allowance and Fee(s) Due mailed Oct. 5, 2011. 9 Pages.

EP Request for Examination dated Nov. 17, 2011 re EP Application No. 10190843.2. 8 Pages.

EP Submission dated Nov. 18, 2011 re EP Application No. 10190837.4. 18 Pages.

Crisp, Richard, "Direct Rambus Technology: The New Main Memory Standard," IEEE Micro, Nov./Dec. 1997, pp. 18-28. 11 pages.

DE Office Action dated Feb. 2, 2011 re DE Application No. 10262341.4. 9 Pages.

Xanthaki, Zacharenia, "A Memory Controller for Access Interleaving Over a Single Rambus", Jul. 1994, FORTH-ICS/TR-124. 62 Pages.

DE Office Action dated Sep. 5, 2011 re DE Application No. 10262341.4. 3 Pages.

DE Summons dated Jul. 31, 2012, DE Application No. 10262341.4. 27 Pages.

German-language DE Office Action dated Nov. 28, 2012 re DE Application No. 10262341.4, 7 Pages, with machine translation into English, also 7 Pages.

MEMORY APPARATUS SUPPORTING MULTIPLE WIDTH CONFIGURATIONS

BACKGROUND

FIG. 1 (prior art) shows an example of a conventional memory system 100. In this example, memory system 100 resides on a computer motherboard 105 and is actually a subsystem of the motherboard. System 100 includes a plurality of female electrical connectors 110, each of which accepts a memory module 115 (only one of which is shown here). Each memory module 115 contains a plurality of memory devices 120, typically packaged as discrete integrated circuits (ICs). Memory devices 120 are usually some type of read/write memory, such as Dynamic Random Access Memories (DRAMS), Static Random Access Memories (SDRAMs), Flash RAM, or other types. Read-Only Memories (ROM) devices might also be used.

Motherboard 105 includes a memory controller 125 connected via conductive traces 130 to connectors 110. Memory controller 125 communicates with memory modules 115 through conductive traces 130. Memory controller 125 also has an interface (not shown) that communicates with other components on the motherboard, allowing those components to read from and write to memory.

Each memory module 115 typically contains a fixed-width data path interface. The fixed-width nature of the interface is generally a result of a desire to create an industry standard interface that can accommodate interoperable modules from a large number of suppliers.

System 100 works with different numbers of memory modules 115 installed, and with modules having different memory capacities and/or organizations. However, a system such as this is normally designed for a specific system data path width, i.e., for a specified number of data bit lines from controller 125 to memory modules 115.

Memory devices can be targeted to a wide variety of markets with very different sets of cost and performance constraints; consequently, the optimal device width can vary significantly from one application to the next. Unfortunately, these variations make it difficult for memory suppliers and distributors to accurately predict the customer demand mix for memory devices of various widths. Inaccuracies in demand-mix prediction can cause supply/demand imbalances and inventory management difficulties, which in turn can lead to pricing instability and highly variable profit margins. Furthermore, a memory device manufacturer may find that optimizing the cost for each target device width means a different design at the die level and potentially at the package level. This can increase the time-to-market and level of financial and engineering resources required to deliver each of these products to market.

Fixed-width devices have other drawbacks related to inflexible data path configuration. Because the system memory interface width and memory device interface widths are fixed, the addition of more memory devices or modules to the system typically requires multiple ranks, which generally necessitates the use of a multi-drop datapath topology. Adding more drops to the system tends to degrade signaling performance.

One way to reduce time-to-market and resource requirements is to create a common die design and package pinout that can support a variety of device data path widths. Some memory manufacturers support this capability through memory designs that allow configurations to be postponed until relatively late in the manufacturing process. A configuration is typically selected through one of several possible schemes, such as fuse or anti-fuse programmability, wire-bonding options, or upper level metal mask changes. This flexibility allows the device to be tested at the target width and sold as a fixed-width device.

Another way to reduce time-to-market and resource requirements associated with fixed-width memories is to use a memory design in which the width (e.g., the number of data pins) can be dynamically changed to suit the needs of a particular system. One such memory design is depicted in U.S. Pat. No. 5,893,927 to William P. Hovis, which is incorporated herein by reference. FIG. 2, taken from the Hovis patent, illustrates a conventional synchronous dynamic random access memory (SDRAM) 200 having a programmable device width. SDRAM 200 includes a clock generator 205 that provides clock signals to various components of SDRAM 200. A command decoder 210 receives chip select /CS, row enable /RAS, column enable /CAS and write command /W inputs. (The "/" preceding the signal names identifies the signals as active low. Overbars are used in the figures for the same purpose.) Command decoder 210 recognizes, for example, a write command when /CS, /CAS, and /W are simultaneously asserted (i.e., logic low). Command decoder 210 then outputs the command to some control logic 215, which controls the operation of the other components of SDRAM 200 based on the received command.

Besides the commands of /CS, /RAS, /CAS and /W, command decoder 210 also recognizes commands based on a combination of /CS, /RAS, /CAS, and /W. For instance, command decoder 210 decodes the simultaneous receipt of /CS, /RAS, /CAS, and /W as a mode register set command. When a mode register set command is received, control logic 215 causes a mode register 220 to latch the address data on address inputs A0-A10 and BA0-BA1.

The data on address inputs A0-A10, generally, represent either a row or column address, whereas the data on address inputs BA0-BA1, generally, represent a bank address. The bank address inputs BA0-BA1 specify one of the memory banks A-D discussed in detail below. During the mode register set operation, however, the data on address inputs A0-A10 and BA0-BA1 represent commands. Hereinafter, the address inputs and the data thereon will generically be referred to as address inputs.

SDRAM 200 includes a row address buffer and refresh counter 225 and a column address buffer and burst counter 230, both of which connect to address inputs A0-A10 and BA0-BA1. The row address buffer portion latches the address inputs at row-access-strobe (RAS) time and provides the row address to the appropriate row decoder 235. The refresh counter portion refreshes the memory. The column address buffer portion latches the address inputs at column-access-strobe (CAS) time and provides the column address to the appropriate column decoder 240. The burst counter portion controls the reading/writing of more than one column based on a pre-set burst length.

The memory of SDRAM 200 is divided into four memory banks A-D that can be independently and simultaneously selected. Each memory bank A-D has associated therewith a row decoder 235, a sense amplifier 255, and a column decoder 240. Based on the address latched by the row address buffer and refresh counter 225, one of row decoders 235 enables a row of bits in the corresponding bank. An associated sense amplifier 255 latches the columns of this row via sense amplification, and the associated column decoder 240 outputs one or more bits depending on the device width and burst length. Sense amplifier 255 typically represents a combination of column I/O amplifiers arranged along an edge of the array of banks and lower-level sense amplifiers interleaved between memory cells.

SDRAM 200 includes configuration logic 260 for setting the device width. Configuration logic 260 connects to mode register 220, and from there receives a memory-width configuration value stored in register 220 during device configuration. Based on this information, configuration logic 260 configures a data control circuit 265, a latch circuit 270, and an input/output (I/O) buffer 275 to obtain the device width associated with the memory-width configuration value. Specifically, configuration logic 260 controls switches and multiplexers in data control circuit 265 such that the number of active I/O drivers corresponds to the programmed device width.

Data control circuit 265 is connected to each column decoder 240, and to data I/O pin(s) DQ(s) via latch circuit 270 and input/output buffer 275. During a read operation, sense amplifiers 255 and column decoders 240 output data to data control circuit 265 based on the row enabled by decoder 235, the column enabled by decoder 240, and the burst length. Data control circuit 265 then routes the data to the number of I/O drivers set based on the device width. The data from the I/O drivers is then latched by the latch circuit 270, buffered by I/O buffer 275, and output on the data I/O pin(s) DQ(s). The number of I/O pin(s) DQ(s) corresponds to the device width.

During a write operation, SDRAM 200 receives data over the I/O pin(s) DQ(s). This data is buffered by I/O buffer 275, latched by latch circuit 270, and received by data control circuit 265. Data control circuit 265 sends the data to the appropriate column decoders 240 for storage in the memory banks A-D according to the enabled row and column.

SDRAM 200 also includes an input DQM to latch circuit 270 for every 8 bits of input/output. For instance a ×16 SDRAM will have two inputs DQM0 and DQM1. When enabled, the input DQM prevents reading or writing the remainder of a burst. In this manner, the burst length can be controlled.

Each read operation presents an entire row of data to sense amps 255. Each write operation similarly involves an entire row. In SDRAM 200, changing the memory width merely changes the number of bits selected from the accessed row: the narrower the memory configuration, the fewer bits are selected from the accessed row. Since the power required to perform a row access does not change with changes in device width, the relative power efficiency of row accesses reduces with memory width.

DETAILED DESCRIPTION

Figure 1:
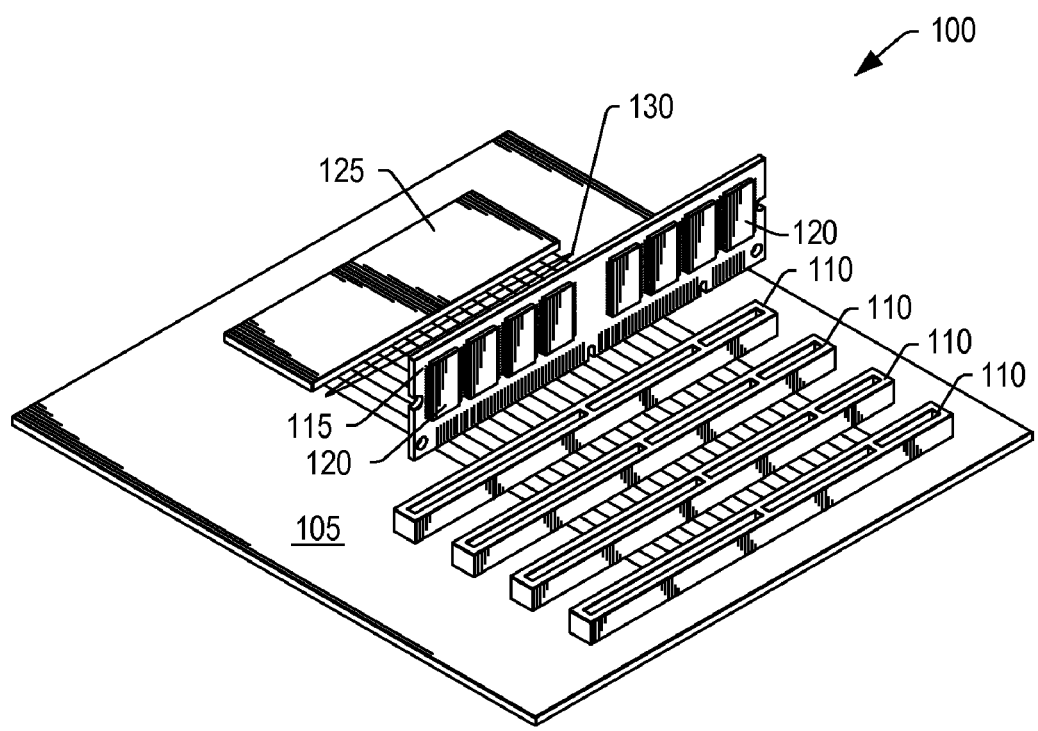
FIG. 1 (prior art) shows an example of a conventional memory system 100.
Figure 2:
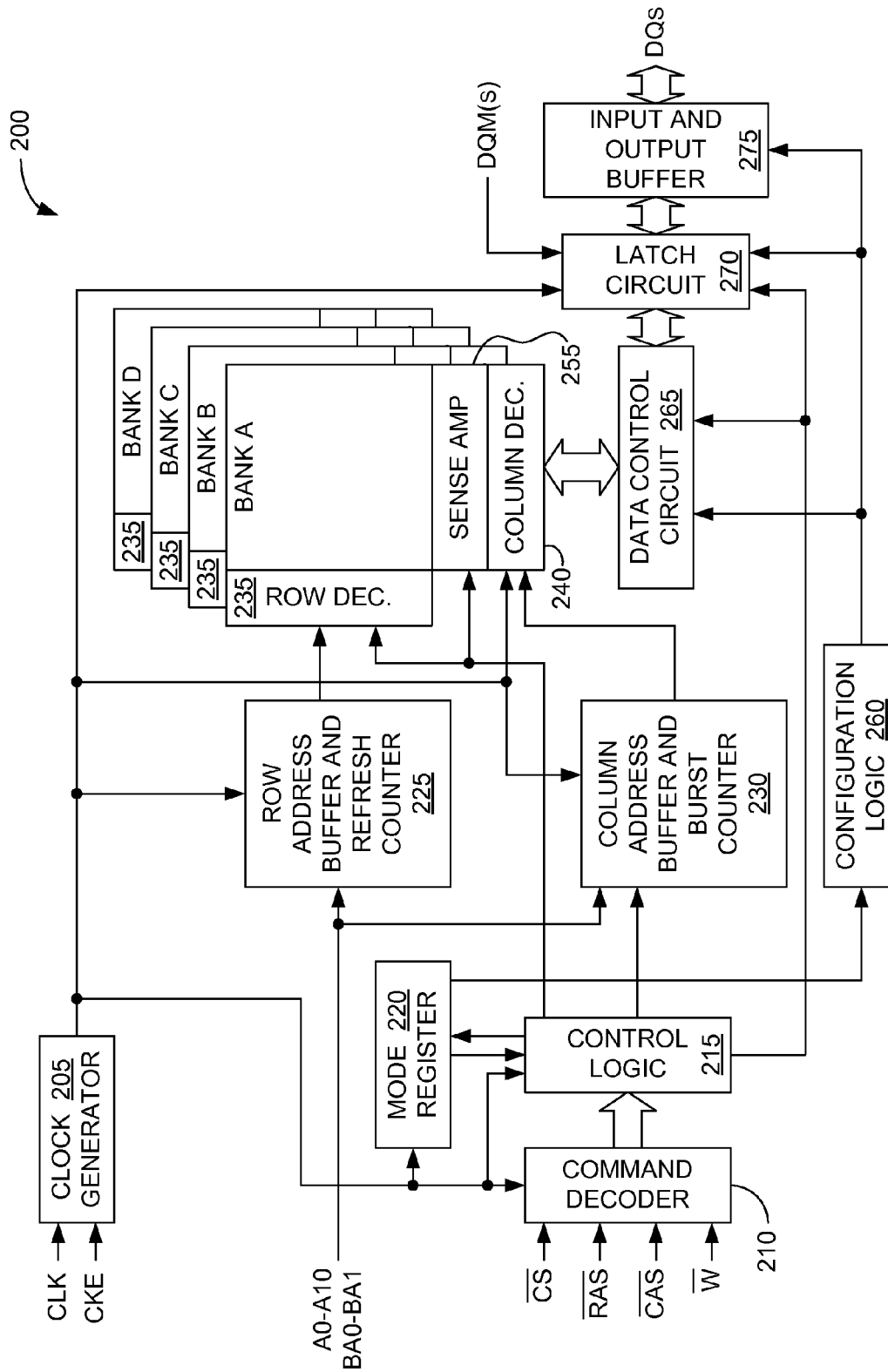
FIG. 2 (prior art) illustrates a conventional synchronous dynamic random access memory (SDRAM) 200 having a programmable device width.
Figure 3:
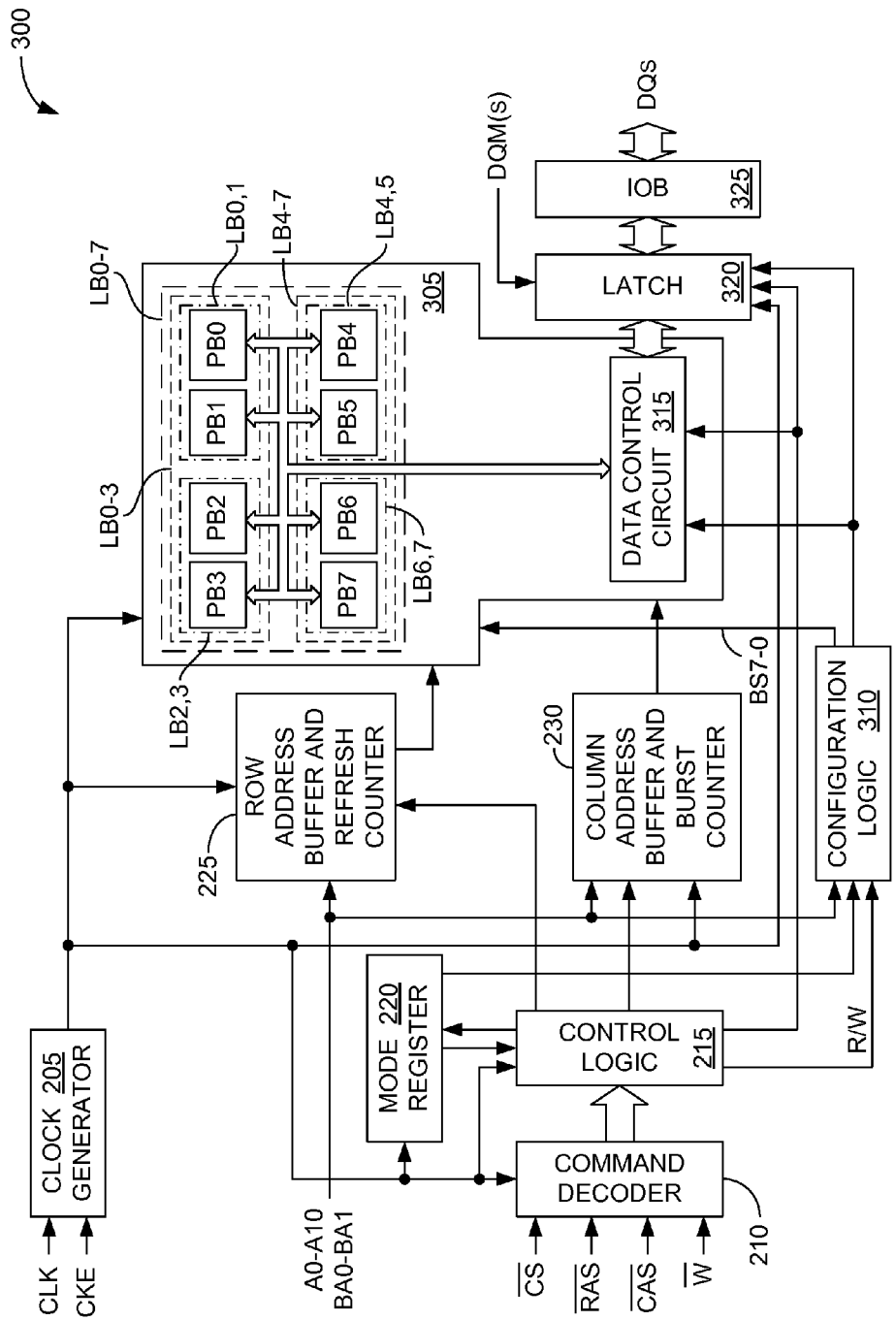
FIG. 3 depicts a variable-width memory 300 in accordance with an embodiment of the invention.

FIG. 3 depicts a variable-width memory 300 in accordance with an embodiment of the invention. Memory 300 is similar to SDRAM 200 of FIG. 2, like-numbered elements being the same. Memory 300 differs from SDRAM 200, however, in that the memory core organization changes with device width, resulting in reduced power usage for relatively narrow memory configurations. Also advantageous, reorganizing the core for relatively narrow memory widths increases the number of logical memory banks, and consequently reduces the likelihood of bank conflicts. Fewer conflicts means improved speed performance. These and other benefits of the invention are detailed below.

Much of the operation of memory 300 is similar to SDRAM 200 of FIG. 2. A discussion of those portions of memory 300 in common with SDRAM 200 is omitted here for brevity. The elements of FIG. 3 described above in connection with FIG. 2 are numbered in the two-hundreds (e.g., 2XX) for convenience. In general, the first digit of numerical designations indicates the figure in which the identified element is introduced.

Memory 300 includes a configurable memory core 305. In the example, memory core 305 includes eight physical memory banks PB0-PB7, though the number of physical banks may vary according to need. Physical banks PB0-PB7 are interconnected such that they can be combined to form different numbers of logical banks. In the example, pairs of physical banks (e.g., PB0 and PB1) can be combined to form four logical banks LB0-LB3, collections of four physical banks (e.g., PB0-PB3) can be combined to form two logical banks LB4 and LB5, and all eight physical banks can be combined to form a single logical bank LB0-7. Assuming, for simplicity, that each physical bank PB0-PB7 includes a single data I/O terminal, memory core 305 can be configured as a one-bit-wide memory with eight logical banks, a two-bit-wide memory with four logical banks, a four-bit-wide memory with two logical banks, or an eight-bit-wide memory with one logical bank.

Some configuration logic 310 controls the configuration of memory core 305 via a data control circuit 315. Configuration logic 310 also controls the data width through a collection of latches 320 and a collection of I/O buffers 325. As detailed below, data control circuit 315 includes some data routing logic, such as a crossbar switch, to provide flexible routing between the memory banks and data terminals DQs. The purpose and operation of these blocks is described below in more detail. As noted in FIG. 3, the data terminals (DQs) can be configured to have widths of ×1, ×2, ×4, and ×8.

Figure 4A:
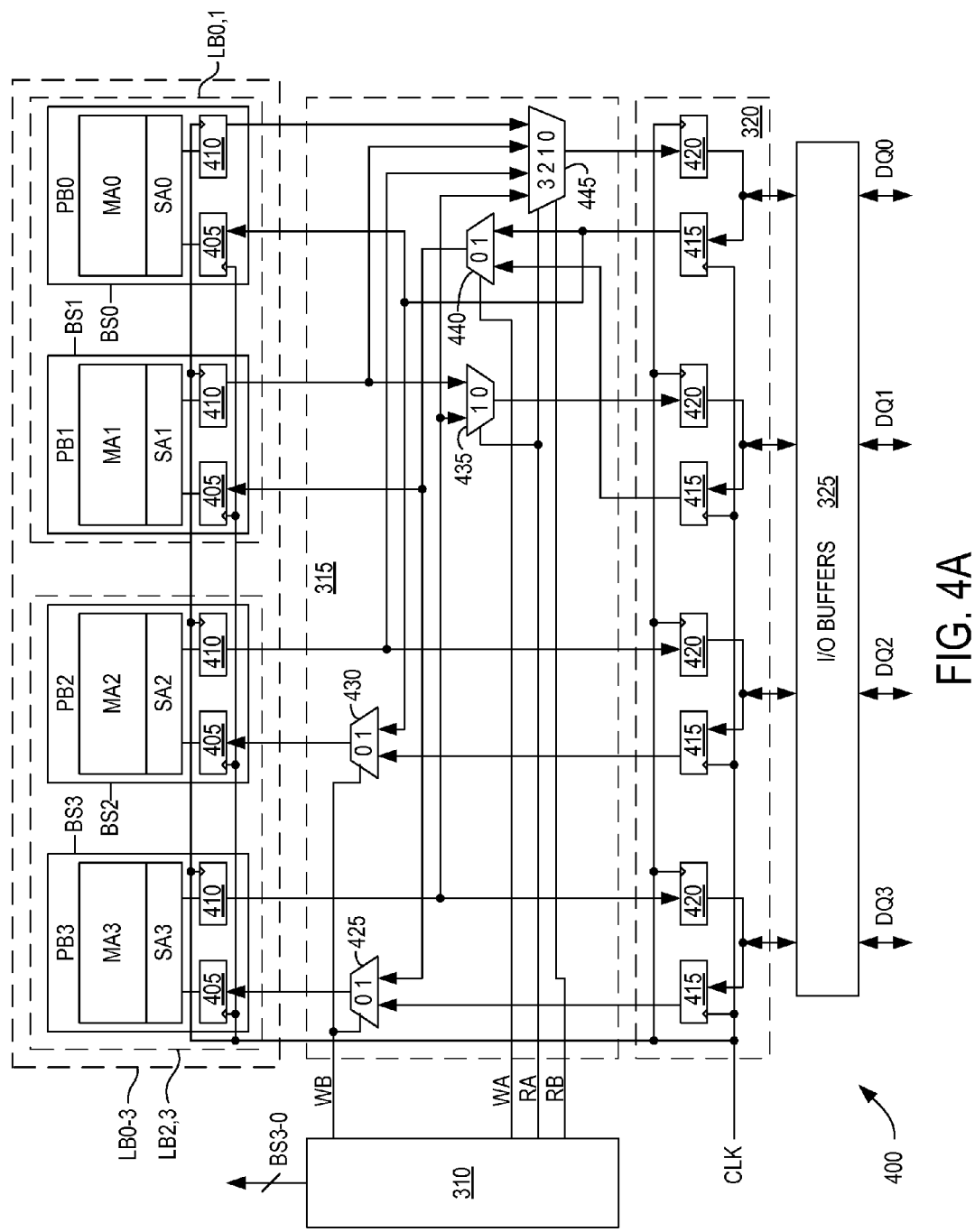
FIG. 4A details a portion of an embodiment of memory 300 of FIG. 3.

FIG. 4A shows a specific implementation of a configurable core 400 and associated circuitry. In one embodiment, core 400 is a portion of memory 300 of FIG. 3. The number of physical banks is reduced to four physical banks PB0-PB3 in FIG. 4 for brevity. Memory 300 might include two memory "slices," each of which comprises a memory core 400. The manner of extending the memory core of FIG. 4A to eight or more banks will be readily apparent to those of skill in the art.

The components of core 400 are similar to like-numbered elements in FIG. 3. For this embodiment, the serialization ratio is 1:1. Serialization ratios greater than 1:1 are possible with the addition of serial-to-parallel (write) and parallel-to-serial (read) conversion circuits. In this example, there are four physical banks PB0-3 supporting four read data bits and four write data bits. Generally, data control circuit 315 contains multiplexing logic for read operations and demultiplexing logic for write operations. The multiplexing logic and demultiplexing logic are designed to allow one, two, or four device data lines DQ0-DQ3 to be routed to the four physical banks PB0-PB3.

In the one-bit wide configuration, device data line D0 can be routed to/from any of the four physical banks PB0-PB3. In the 2-bit wide configuration ("×2"), device data lines DQ0 and DQ1 can be routed to/from physical banks PB0 and PB1 (collectively, logical bank LB0,1) or physical banks PB2 and PB3 (collectively logical banks LB2,3). Finally, in the 4-bit wide configuration, device data lines DQ0, DQ1, DQ2, and DQ3 can be routed to/from respective physical banks PB0, PB1, PB2, and PB3 (collectively, logical bank LB0-3). Core 400 can thus be configured as a one-, two-, or four-bank memory with respective widths of four (×4), two (×2), and one (×1) data bits.

Core 400 is a synchronous memory; consequently, each physical bank PB0-PB3 includes an input latch 405 and an output latch 410. Physical banks PB0-PB3 additionally include respective memory arrays MA0-MA3, sense amplifiers SA0-SA3, and bank-select terminals BS1-BS3. Asserting a bank select signal on one of terminals BS1-BS3 loads the data in the addressed location within the selected memory array into the respective one of sense amplifiers SA1-1A3.

Latch 320 includes a pair of latches 415 and 420 for each physical bank PB0-PB3. Data control circuit 315 includes five multiplexers 425, 430, 435, 440, and 445 that communicate data between latch 320 and physical banks PB0-PB3. Multiplexers 425 and 430 are controlled by a write control signal WB; multiplexer 435 is controlled by a read control signal RA; multiplexer 440 is controlled by a write control signal WA; and multiplexer 445 is controlled by two read control signals RA and RB. Write control signals WA and WB and read control signals RA and RB are based on the selected data path width and bits of the requested memory address or transfer phase. Configuration logic 310 (FIG. 3) produces these signals in response to the programmed data width, whether the operation is a read or write operation, and appropriate addressing information.

Table 1 shows the control values used for data path slice widths of one, two, and four. Table 1 also indicates which of data terminals D0-D3 are used for each data width.

TABLE 1

| WIDTH | WRITE | | READ | | DATA TERMINALS |
|---|---|---|---|---|---|
| | WA | WB | RA | RB | |
| 1 | 1 | 1 | A0 | A1 | DQ0 |
| 2 | 0 | 1 | 0 | A0 | DQ0 & DQ1 |
| 4 | 0 | 0 | 0 | 0 | DQ0, DQ1, DQ2, & DQ3 |

When a width of one is selected during a read operation, the configuration logic 310 allows data from any one of the four physical banks PB0-PB3 to be presented at data terminal DQ0. Control signals RA and RB determine which data-bit signals will be presented at any given time. Control signals RA and RB are set (at this data width) to equal the two least-significant bits (A1, A0) of the memory address corresponding to the current read operation.

When a width of one is selected during a write operation, the circuit accepts the data bit signal from data terminal DQ0 and routes it to all four physical banks PB0-PB3 simultaneously. Control signals WA and WB are both set to a logical value of one to produce this routing. Other logic circuits (not shown) within configuration logic 310 control which of input latches 405 and 410 are active during any single write operation, so that each data bit signal is latched into the appropriate physical bank. For a given physical bank, only one of latches 405 and 410 is active during any given memory cycle.

When a width of two is selected during a read operation, configuration logic 310 allows two of the four data bit signals associated with physical banks PB0-PB3 to be present at data terminals DQ0 and DQ1. To obtain this result, control signal RA is set to 0, and control signal RB is equal to the lower bit (A0) of the memory address corresponding to the current read operation. Control signal RB determines which of two pairs of data bit signals (0 and 1 or 2 and 3) are presented at data terminals DQ0 and DQ1 during a given read operation.

When a width of two is selected during a write operation, configuration logic 310 accepts the data bit signals from physical banks PB0 and PB1 and routes them either to data terminals DQ0 and DQ1 or DQ2 and DQ3. In this configuration, physical banks PB0 and PB1 collectively form one logical bank LB0,1 and physical banks PB2 and PB3 collectively form a second logical bank LB2,3. Control signals WA and WB are set to 0 and 1, respectively, to obtain this result.

A width of four is selected by setting all of the control signals (RA, RB, WA, and W,) to 0. Read and write data signals are then passed directly between physical banks PB0-PB3 and corresponding data terminals DQ0-DQ3.

For each row access, data moves from memory arrays MA0-MA3 to their respective sense amplifiers SA0-SA3. Core 400 minimizes the power required to perform a row access by limiting each row access to the selected physical bank(s). To this end, bank-select signals on lines BS0-BS3 are only asserted to selected banks.

Configuration logic 310 determines which of physical banks PB0-PB3 are selected, and consequently which bank-select signals are asserted, based upon the selected device width and memory address. The following Table 2 summarizes the logic within configuration logic 310 that generates the appropriate bank-select signals.

TABLE 2

| | ADDRESS LINES A1: A0 | | | |
|---|---|---|---|---|
| WIDTH | 00 | 01 | 10 | 11 |
| 1 | BS0 | BS1 | BS2 | BS3 |
| 2 | BS0 & BS1 | BS2 & BS3 | BS0 & BS1 | BS2 & BS3 |
| 4 | BS0-BS3 | BS0-BS3 | BS0-BS3 | BS0-BS3 |

When core 400 is configured to have a width of one, the two least-significant address bits A0 and A1 are decoded to select one of physical banks PB0-PB3; when core 400 is configured to have a width of two, address bit A0 enables the physical banks within either of logical banks LB0,1 or LB2,3; and when core 400 is configured to have a width of four, address bits A0 and A1 are ignored and all physical banks PB0-PB3 are selected (i.e., enabled).

The circuit of FIG. 4A is just one example of many possible designs. Other embodiments will benefit from other configurations. For example, it is possible to use more or less elaborate data routing schemes to account for the different connection needs for memory systems with more or fewer modules. Moreover, multiple memory cores 400 may be used to construct devices with greater than four device data connections. For example, a device having sixteen device data connections could use four memory cores while supporting three programmable widths; namely, 16, 8, or 4-bits widths. There are many possible alternatives for the number and width of physical and logical banks, the number of device data connections per device, serialization ratios, and data-path widths.

Figure 4B:
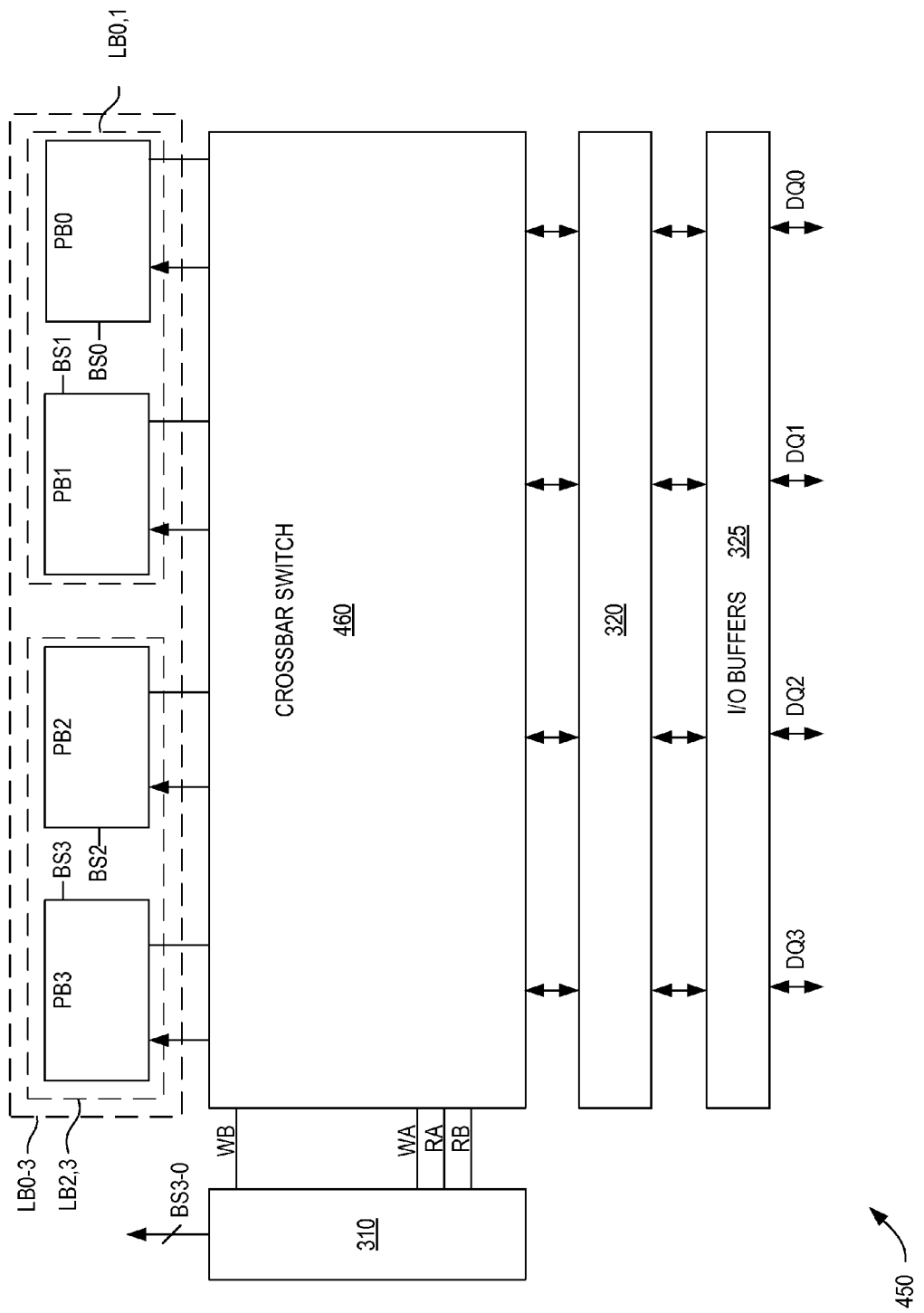
FIG. 4B details a portion of another embodiment memory 300 of FIG. 3.

All data to and from memory core 400 passes through data terminal DQ0 in the ×1 mode, terminals DQ0 and DQ1 in the ×2 mode, and terminals DQ0-DQ3 in the ×4 mode. FIG. 4B depicts an embodiment 450 that benefits from a more flexible routing scheme in which the data terminals DQ0-DQ3 can be routed to different input/output pins of the memory module upon which core 305 is mounted. Embodiment 450 substitutes data control circuit 315 of FIG. 4A with a more flexible crossbar switch 460. In the depicted embodiment, the data terminals to and from physical bank PB0 can be routed to any of data connections DQ0-DQ3 in the ×1 mode; the data terminals to and from physical banks PB0 and PB1 can be routed to either data connections DQ0 and DQ1 or data connections DQ2 and DQ3, respectively, in the ×2 mode; and the data terminals to and from physical banks PB0-PB3 can be routed to data connections DQ0-DQ3, respectively, in the ×4 mode. U.S. Pat. Nos. 5,530,814 and 5,717,871 describe various types of crossbar switches, and are incorporated herein by reference.

Figure 5A:
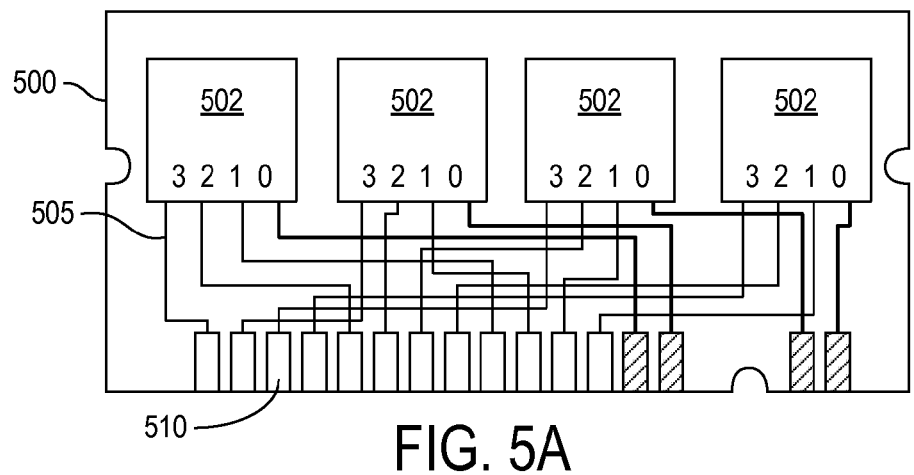
FIGS. 5A-5C depict various width configurations of a memory module 500 that includes four variable-width memories 300 of the type described above in connection with FIGS. 3 and 4.

FIG. 5A depicts a memory module 500 that includes four variable-width memories 502 of the type described above in connection with FIGS. 3, 4A, and 4B. Module 500, typically a printed circuit board, also includes a number of conductive traces 505 that convey data between the data pins (3, 2, 1, 0) of memories 502 and corresponding module pins 510. In FIG. 5A, each memory 502 is configured to be one-bit wide, and the resulting four data bits are connected to four consecutive ones of pins 510. The selected traces are identified as bold lines; the selected module pins are crosshatched.

Figure 5B:
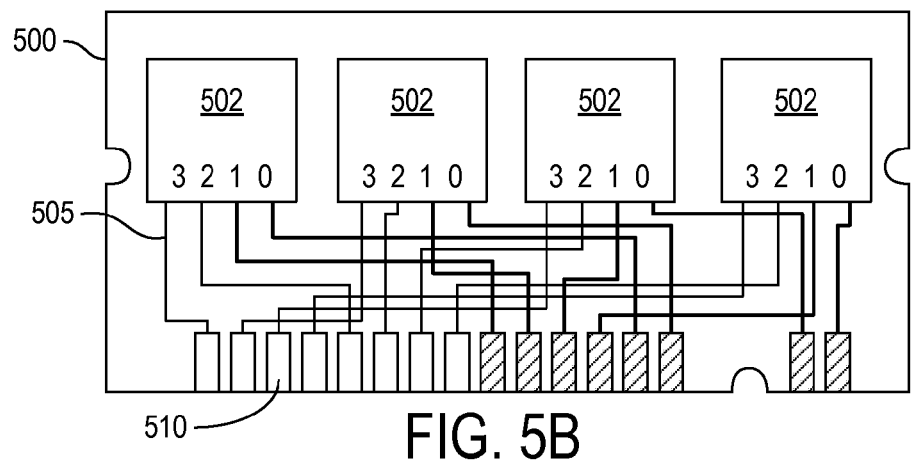

FIG. 5B depicts the same memory module 500 of FIG. 5A; unlike in FIG. 5A, however, each memory 502 is configured to be two-bits wide, and the resulting eight data bits are connected to eight consecutive ones of pins 510. The memory module 500 of FIG. 5B is thus configured to be twice as wide (and half as deep) as the same module 500 of FIG. 5A. As in FIG. 5A, the selected traces are identified as bold lines; the selected pins are crosshatched.

Figure 5C:
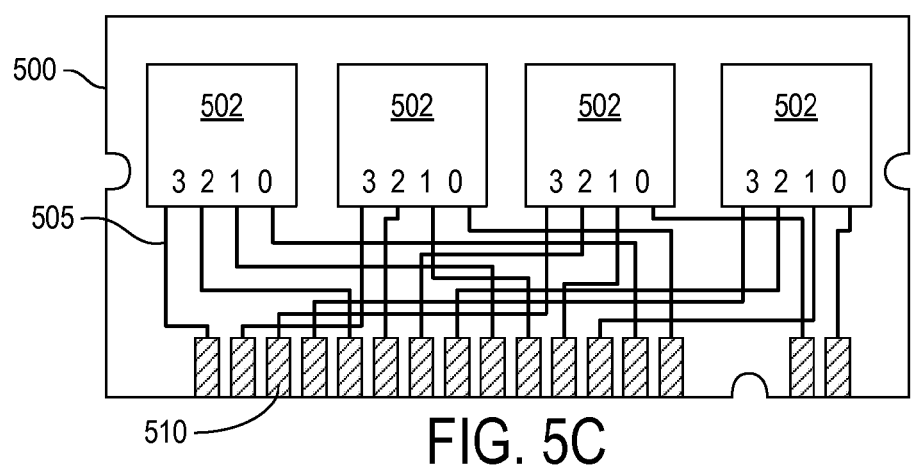

FIG. 5C depicts the same memory module 500 of FIGS. 5A and 5B; unlike in FIGS. 5A and 5B, however, each memory 502 is configured to be four-bits wide, and the resulting sixteen data bits are connected to sixteen consecutive ones of pins 510. The memory module 500 of FIG. 5C is thus configured to be twice as wide (and half as deep) as the same module 500 of FIG. 5B and four times as wide (and one forth as deep) as the same memory module 500 of FIG. 5A. Once again, the selected traces are identified as bold lines; the selected pins are crosshatched.

Figure 6A:
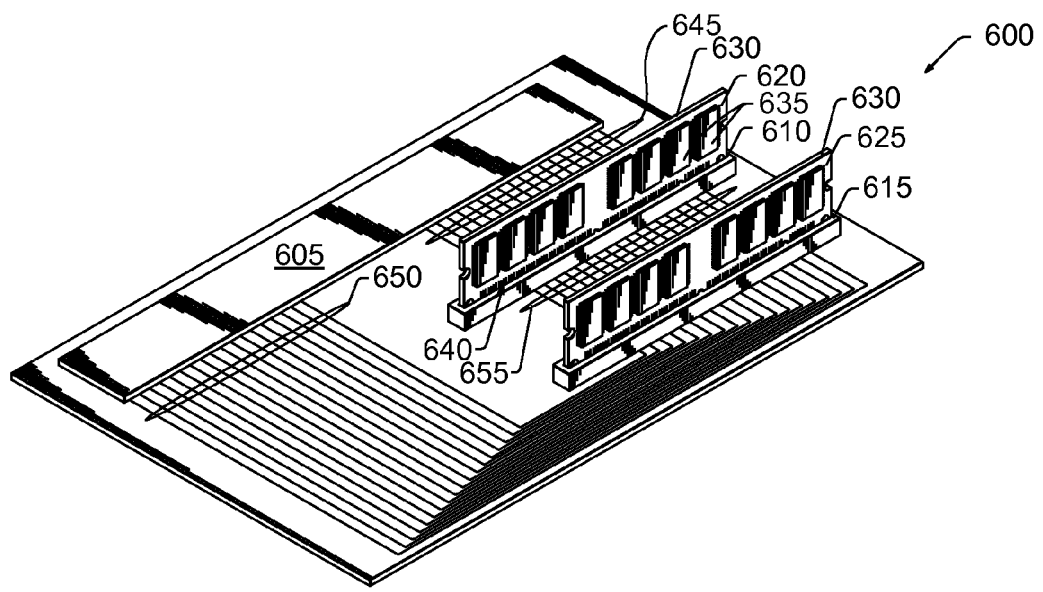
FIGS. 6A and 6B depict a computer motherboard 600 adapted to use a variable-width memory in accordance with an embodiment of the invention.
Figure 6B:
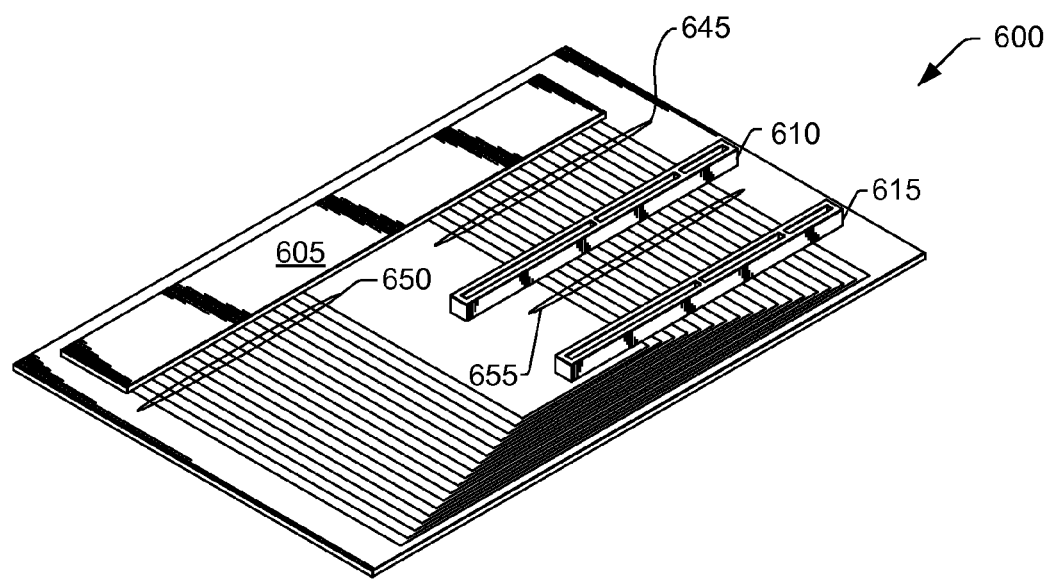

FIGS. 6A and 6B depict a computer motherboard (or system backplane) 600 adapted to use a variable-width memory in accordance with an embodiment of the invention. Motherboard 600 includes a memory controller 605 and a plurality of electrical receptacles or connectors 610 and 615. The connectors are memory module sockets, and are configured to receive installable/removable memory modules 620 and 625.

Each of memory modules 620 and 625 comprises a module backplane 630 and a plurality of integrated memory circuits 635. Each memory module also includes first and second opposed rows of electrical contacts (module pins) 640 along opposite surfaces of its backplane. Only one row of contacts 640 is visible in FIG. 6A. There are corresponding rows of connector contacts (not visible in FIG. 6A) in each of connectors 610 and 615.

A plurality of signal lines, or "traces," extends between memory controller 605 and electrical connectors 610 and 615 for electrical communication with memory modules 620 and 625. More specifically, there are a plurality of sets of signal lines, each set extending to a corresponding, different one of connectors 610 and 615. A first set of signal lines 645 extends to first electrical connector 610, and a second set of signal lines 650 extends to second electrical connector 615. Motherboard 600 also has a third set of signal lines 655 that extends between the two connectors.

In the embodiment shown, the signal lines comprise system data lines—they carry data that has been read from or that is to be written to memory modules 620 and 625. It is also possible that other signal lines, such as address and control lines, would couple to the memory modules through the connectors. These additional signal lines could have a different interconnection topology than what is shown for signal lines 645, 650, and 655.

The routing of the signal lines is more clearly visible in FIG. 6B, in which memory modules 620 and 625 have been omitted for clarity. The illustrated physical routing is shown only as a conceptual aid—actual routing is likely to be more direct, through multiple layers of a printed-circuit board.

Figure 7:
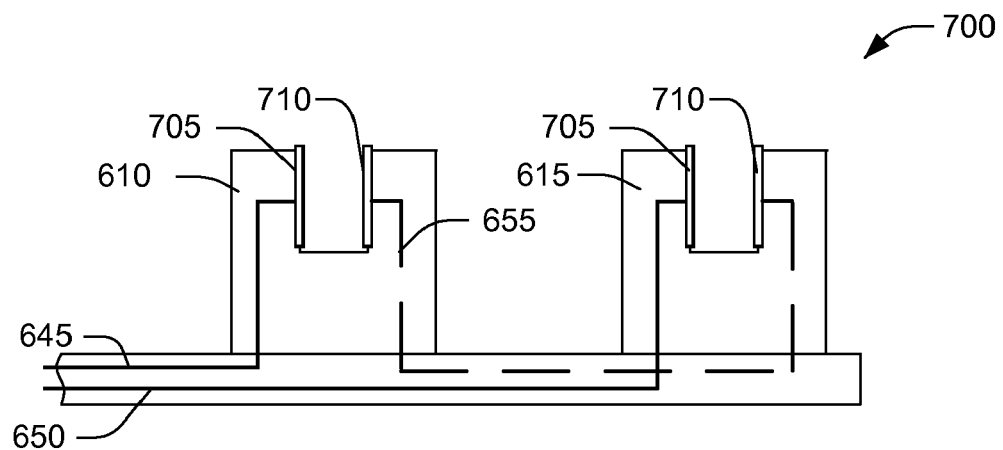
FIG. 7 depicts a portion 700 of motherboard 600 detailing the signal-line configuration.

FIG. 7A depicts a portion 700 of motherboard 600 detailing the signal-line configuration. This view shows cross-sections of connectors 610 and 615. Electrical conductors, traces, and/or contacts are indicated symbolically in FIG. 7A by relatively thick solid or dashed lines. Each of the three previously described sets of signal lines is represented by a single one of its conductors, which has been labeled with the reference numeral of the signal line set to which it belongs. The respective lines of a particular set of signal lines are routed individually in the manner shown.

As discussed above, each connector 610 and 615 has first and second opposed rows of contacts. FIG. 7A shows individual contacts 705 and 710 corresponding respectively to the two contact rows of each connector. It is to be understood that these, again, are representative of the remaining contacts of the respective contact rows.

As is apparent in FIG. 7A, the first set of signal lines 645 extends to first contact row 705 of first connector 610. The second set of signal lines 650 extends to the first contact row 705 of second connector 615. In addition, a third set of signal lines 655 extends between the second contact row 710 of first connector 610 and second contact row 710 of second connector 615. The third set of signal lines 655 is represented by a dashed line, indicating that these lines are used only in certain configurations; specifically, signal lines 655 are used only when a shorting module is inserted into connector 610 or 615. Such a shorting module, the use of which will be explained in more detail below, results in both sets of signal lines 645 and 650 being configured for communications with a single memory module.

Figure 8:
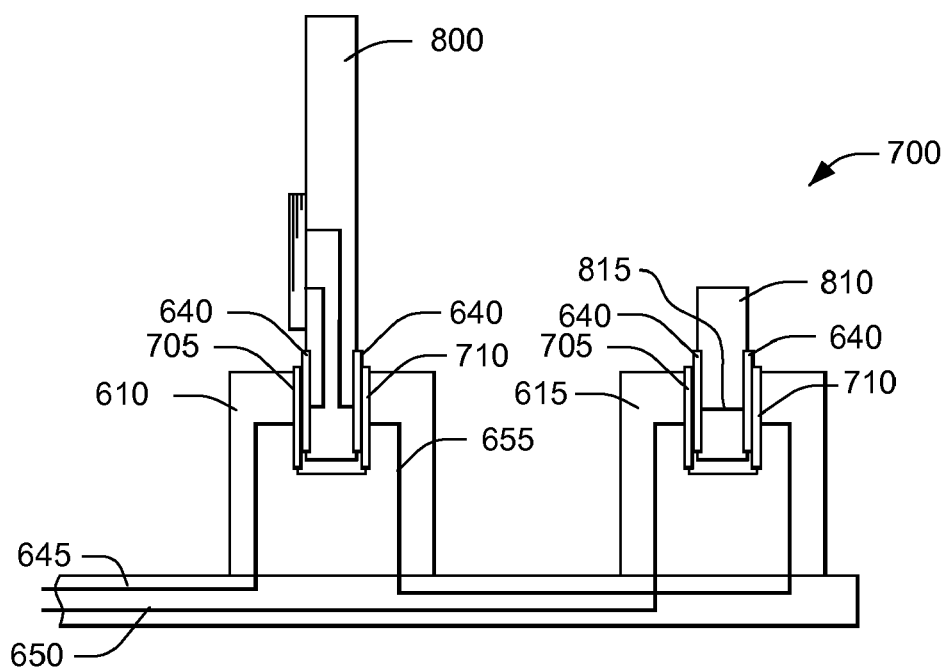
FIG. 8 depicts portion 700 of FIG. 7 with a memory module 800 and shorting module 810 installed.

The system of FIG. 7A can be configured to include either one or two memory modules. FIG. 8 illustrates the first configuration, which includes a memory module 800 in the first connector 610 and a shorting module 810 in the second connector 615. The shorting module has shorting conductors 815, corresponding to opposing pairs of connector contacts, between the first and second rows of the second connector. Inserting shorting module 810 into connector 615 connects or couples the second set 650 of signal lines to the second contact row 705 of first connector 610 through the third set of signal lines 655. In this configuration, the two sets of signal lines 645 and 650 are used collectively to communicate between memory controller 605 and memory module 800.

In a two-module configuration, shorting bar 810 is replaced with a second memory module 800. If modules 800 are adapted in accordance with the invention to support two width configurations and to include one half of the module pins 640 on either side, then there is no need for a switch matrix like data control circuit 315 of FIG. 4A or crossbar switch 460 of FIG. 4B. Instead, merely including shorting module 810 provides the memory controller access to the module pins 640 on both sides of the one module 800. Alternatively, including two memory modules 800 will provide the memory controller access to the same half of the module pins 640 (those on the left-hand side of connector 610) on both memory modules; the other half of the module pins 640 are not used. More complex routing schemes can likewise be employed to support additional modules and width configurations. The two-module configuration thus provides the same data width as the single-module configuration, with each module providing half the width.

For a more detailed discussion of motherboard 600, see U.S. patent application Ser. No. 09/797,099 filed Feb. 28, 2001, entitled "Upgradeable Memory System with Reconfigurable Interconnect," by Richard E. Perego et al., which issued Oct. 27, 2009, as U.S. Pat. No. 7,610,447 and is incorporated herein by reference.

In some embodiments, the access configurations of the memory modules are controllable and programmable by memory controller 605 in the manner described above in connection with FIGS. 3, 4A, 4B, 5A, and 5B. In such embodiments, the memory controller may be adapted to detect which connectors have installed memory modules, and to set the configuration of each module accordingly. This allows either one or two memory module to be used in a system without requiring manual configuration steps. If one module is used, it may be configured to use two signal-line sets for the best possible performance. If two memory modules are present, they may each be configured to use one signal-line set. This idea can be extended to support memory systems that can accommodate more than two memory modules, though the routing scheme becomes more complex with support for additional modules.

The integrated memory circuit can be configured for the appropriate access mode using control pins. These control pins might be part of the signal line sets 645, 650, and 655, or they might be part of a different set of signal lines. These control pins might be dedicated to this configuration function, or they might be shared with other functions. Also, the integrated memory circuit might utilize programmable fuses to specify the configuration mode. Integrated memory circuit configurability might also be implemented, for example, by the use of jumpers on the memory modules. Note that the memory capacity of a module remains the same regardless of how it is configured. However, when it is accessed through one signal line set it requires a greater memory addressing range than when it is accessed through two signal line sets. Also note that the two configurations shown in FIGS. 6-8 could also be implemented with a shorting connector instead of a shorting module. A shorting connector shorts its opposing contacts when no module is inserted (the same result as when the connector 615 of FIG. 7B has a shorting module inserted). A shorting connector with a memory module inserted is functionally identical to the connector 610 in FIG. 7.

As noted above, the general signal line scheme can be generalized for use with n connectors and memory modules. Generally stated, a system such as this uses a plurality of signal-line sets, each extending to a respective module connector. At least one of these sets is configurable or bypassable to extend to a connector other than its own respective connector. Stated alternatively, there are 1 through n sets of signal lines that extend respectively to corresponding connectors 1 through n. Sets 1 through n−1 of the signal lines are configurable to extend respectively to additional ones of the connectors other than their corresponding connectors. FIGS. 9A-9D illustrate this generalization, in a memory system 900 in which n=4.

Figure 9A:
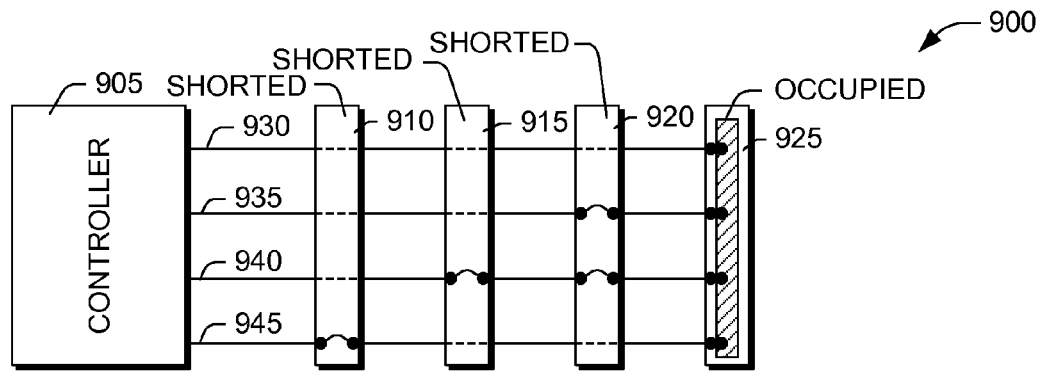
FIGS. 9A-9D depict memory configurations that respectively accommodate one, two, three, or four memory modules.

Referring first to FIG. 9A, this configuration includes a memory controller 905; four memory slots or connectors 910, 915, 920, and 925; and four signal line sets 930, 935, 940, and 945. Each signal line set is shown as a single line, and is shown as a dashed line when it extends beneath one of the connectors without connection. Physical connections of the signal line sets to the connectors are shown as solid dots. Inserted memory modules are shown as diagonally hatched rectangles, with solid dots indicating signal connections. Note that each inserted memory module can connect to up to four signal line sets. The number of signal line sets to which it actually connects depends upon the connector into which it is inserted. The connectors are identical components, but appear different to the memory modules because of the routing pattern of the four signal line sets on the motherboard.

Each signal line set extends to a corresponding connector. Furthermore, signal lines sets 935, 940, and 945 are extendable to connectors other than their corresponding connectors: signal line set 935 is extendable to connector 925; signal line set 940 is extendable to both connectors 920 and 925; signal line set 945 is extendable to connector 925. More specifically, a first signal line set 930 extends directly to a first memory connector 925 without connection to any of the other connectors. It connects to corresponding contacts of the first contact row of connector 925. A second signal line set 935 extends directly to a second memory connector 920, where it connects to corresponding contacts of the first contact row. The corresponding contacts of the second contact row are connected to corresponding contacts of the first contact row of first connector 925, allowing the second signal line set to bypass second connector 920 when a shorting module is placed in connector 920.

A third signal line set 940 extends directly to a third memory connector 915, where it connects to corresponding contacts of the first contact row. The corresponding contacts of the second contact row are connected to corresponding contacts of the first contact row of connector 920. The corresponding second contact row contacts of connector 920 are connected to the corresponding contacts of the first contact row of connector 925.

A fourth signal line set 945 extends directly to a fourth memory connector 910, where it connects to corresponding contacts of the first contact row of connector 910. The corresponding contacts of the second contact row are connected to corresponding contacts of the first contact row of first connector 925.

This configuration, with appropriate use of shorting or bypass modules, accommodates one, two, three, or four physically identical memory modules. Each memory module permits simultaneous access through one, two, or four of its four available signal line sets. In the configuration of FIG. 9A, a single memory module is inserted in first connector 925. This memory module is configured to permit simultaneous accesses on all of its four signal line sets, which correspond to all four signal line sets. Connectors 910, 915, and 920 are shorted by inserted shorting modules as shown so that signal line sets 935, 940, and 945 extend to connector 925.

Figure 9B:
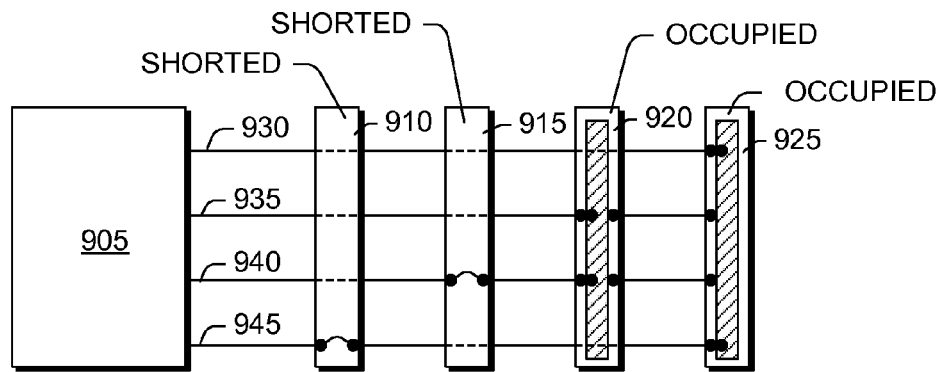

FIG. 9B illustrates a second configuration in which connectors 910 and 915 are shorted by inserting shorting modules. Thus, signal line sets 930 and 945 extend to connector 925 and the inserted memory module is configured to permit simultaneous accesses on these two signal line sets. Signal line sets 935 and 940 extend to connector 920 and the inserted memory module is configured to permit simultaneous accesses on these two signal line sets.

Figure 9C:
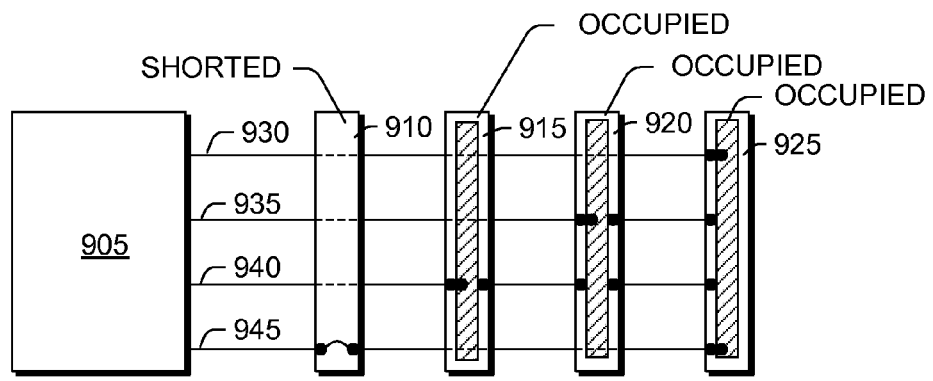

FIG. 9C illustrates a third configuration in which connector 910 is shorted by inserting a shorting module, and memory modules are positioned in connectors 915, 920, and 925. Signal line sets 930 and 945 extend to connector 925 and the inserted memory module is configured to permit simultaneous accesses on these two signal line sets. Signal line set 935 extends to connector 920 and the inserted memory module is configured to permit accesses on this signal line set. Signal line set 940 extends to connector 915 and the inserted memory module is configured to permit accesses on this signal line set.

Figure 9D:
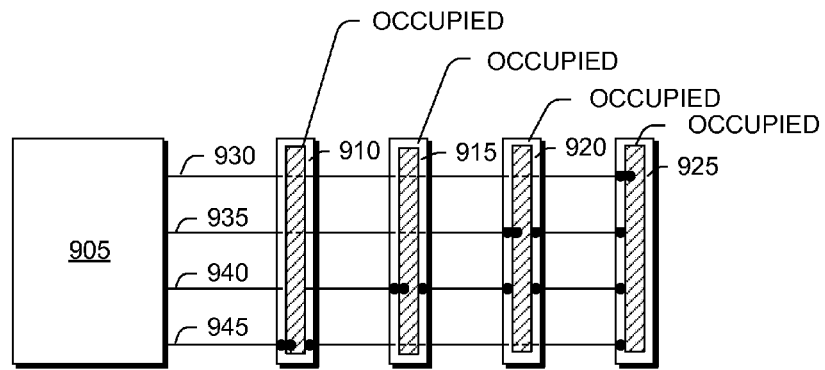

FIG. 9D illustrates a fourth configuration, with a memory module in each of the four available memory connectors. Each module is connected to use a respective one of the four signal line sets, with no shorting modules in use.

An interesting aspect of a memory device with programmable data access width relates to the characteristic of the device that its bandwidth may generally be reduced as its data width is narrowed. As device bandwidth is reduced, opportunities increase for altering the device's memory array configuration to provide greater independence between array partitions.

Figure 10:
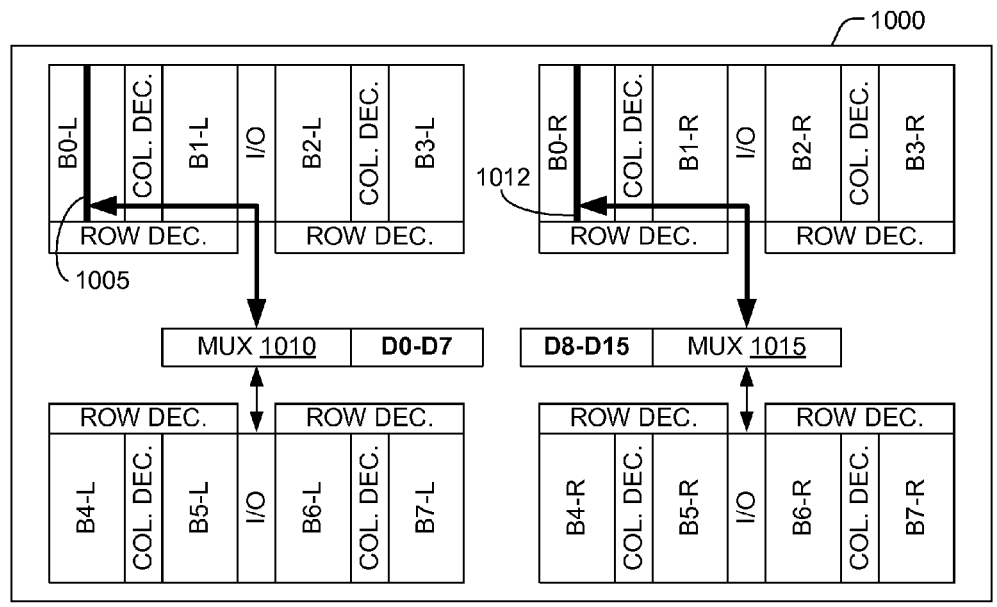
FIG. 10 (prior art) shows a floor plan of a conventional 1 Gb DRAM 1000 having a 16-bit wide data path D0-D15.

FIG. 10 shows an example of a conventional 1 Gb density DRAM 1000 with a 16-bit wide data path D0-D15. FIG. 10 shows a high-level floor plan of the DRAM die, including left ("L") and right ("R") bank subdivisions, row decoders, column decoders, I/O sense amps (I/O), and data pin locations D0-D7 and D8-D15. A pair of regions 1005 and 1012 within memory banks B0-L and B0-R (i.e., the left and right halves of bank 0) indicates a sample page location for an 8 KB page within bank zero. 4 KB worth of sense amp circuitry for the left and right halves of DRAM 1000 are accessed in parallel via a pair of multiplexers 1010 and 1015 to form an 8 KB page. In this design, data from left and right halves of the die are accessed in parallel to meet the device peak bandwidth requirement. This also allows the data paths for the left and right halves of the die to be largely independent. (This aspect of some embodiments is discussed in more detail below in connection with FIG. 12.)

Figure 11A:
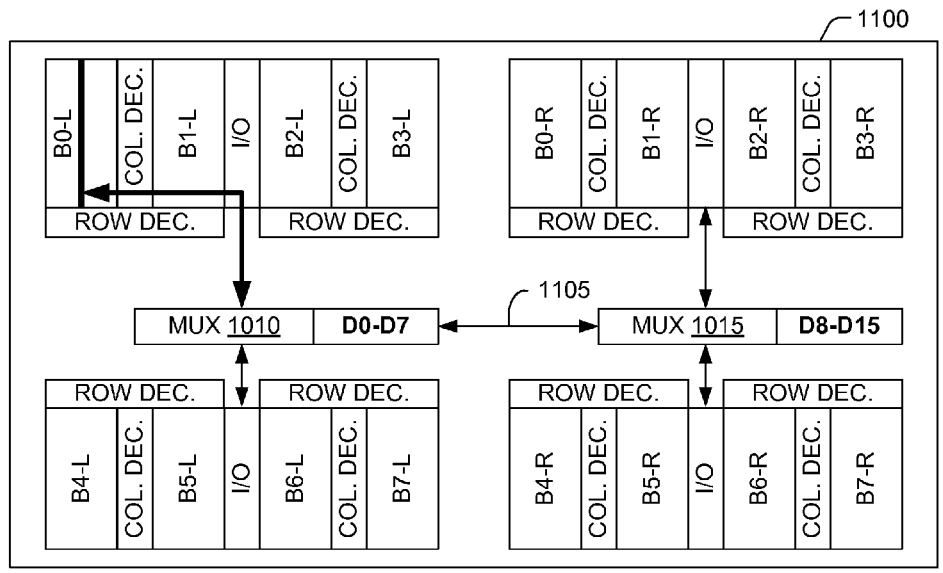
FIGS. 11A and 11B depict a high-level floor plan of a DRAM 1100 featuring a configurable core.
Figure 11B:
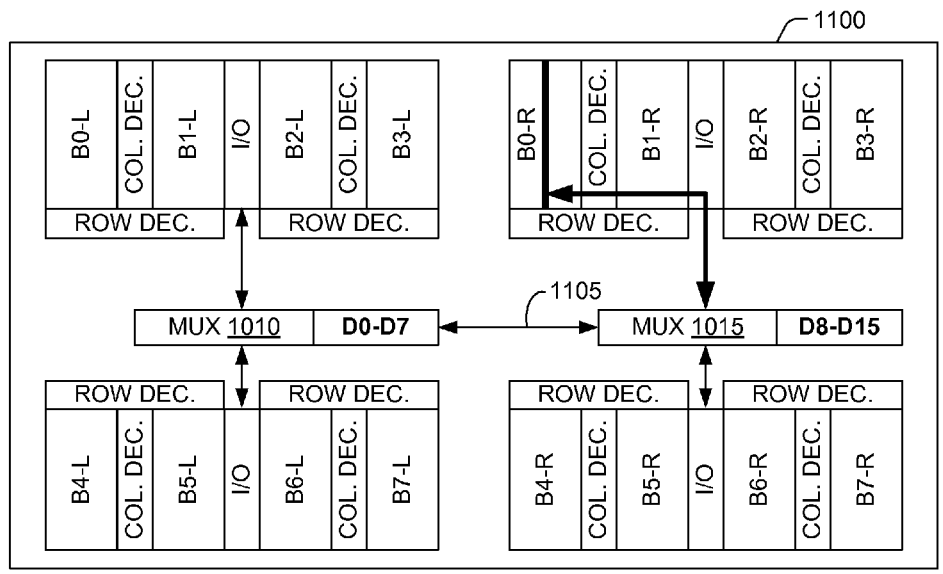

FIGS. 11A and 11B depict a high-level floor plan of a DRAM 1100 featuring a configurable core in accordance with one embodiment. DRAM 1100 can operate as DRAM 1000 of FIG. 10, but can also be configured to reduce peak device bandwidth by a factor of two. Such a bandwidth reduction allows the full amount of device bandwidth to be serviced by either the left half (FIG. 11A) or right half (FIG. 11B) of the device. In this embodiment, the eight active device data connections D0-D7—shown in bold—are located on the left side of the die, requiring that a data path 1105 be provided from the right side memory array to the left side data connections D0-D7. With the memory array divided into left and right halves, it becomes feasible to manage banks on each side independently. In this case, the 16-bit wide device that supported eight independent banks accessed via data terminals D0-D15 (like DRAM 1000 of FIG. 10) can be reconfigured as an 8-bit wide device supporting 16 independent banks, with data access provided via either data terminals D0-D7 or D8-D15.

There is typically some incremental circuit overhead associated with increasing the bank count of the device, setting a practical limit to the number of independent banks that could potentially be supported. However, a performance improvement related to the increased number of banks may justify some increase in device cost.

In the embodiment of FIGS. 11A and 11B, device page size is reduced for the 8-bit wide configuration (4 KB) relative to the 16-bit wide configuration (8 KB). Reducing the page size is attractive from a power consumption perspective because fewer sense amps are activated during a RAS operation. In addition to activating fewer sense amps, it is also possible to subdivide word lines using a technique known as "sub-page activation." In this scheme, word lines are divided into multiple sections, one or more of which are activated for a particular RAS operation. This technique typically adds some incremental die area overhead in exchange for reduced power consumption and potentially improved array access or cycle times.

The examples highlighted in FIGS. 11A and 11B are intended to illustrate the concept of how a configurable array organization can be used to reduce power consumption and increase the number of logical memory banks. Write transactions are not described for this embodiment, although the same principles of power reduction and memory bank count apply to writes as well. The basic principles of configurable array organization can be exploited regardless of the type or capacity of memory device.

Figure 12:
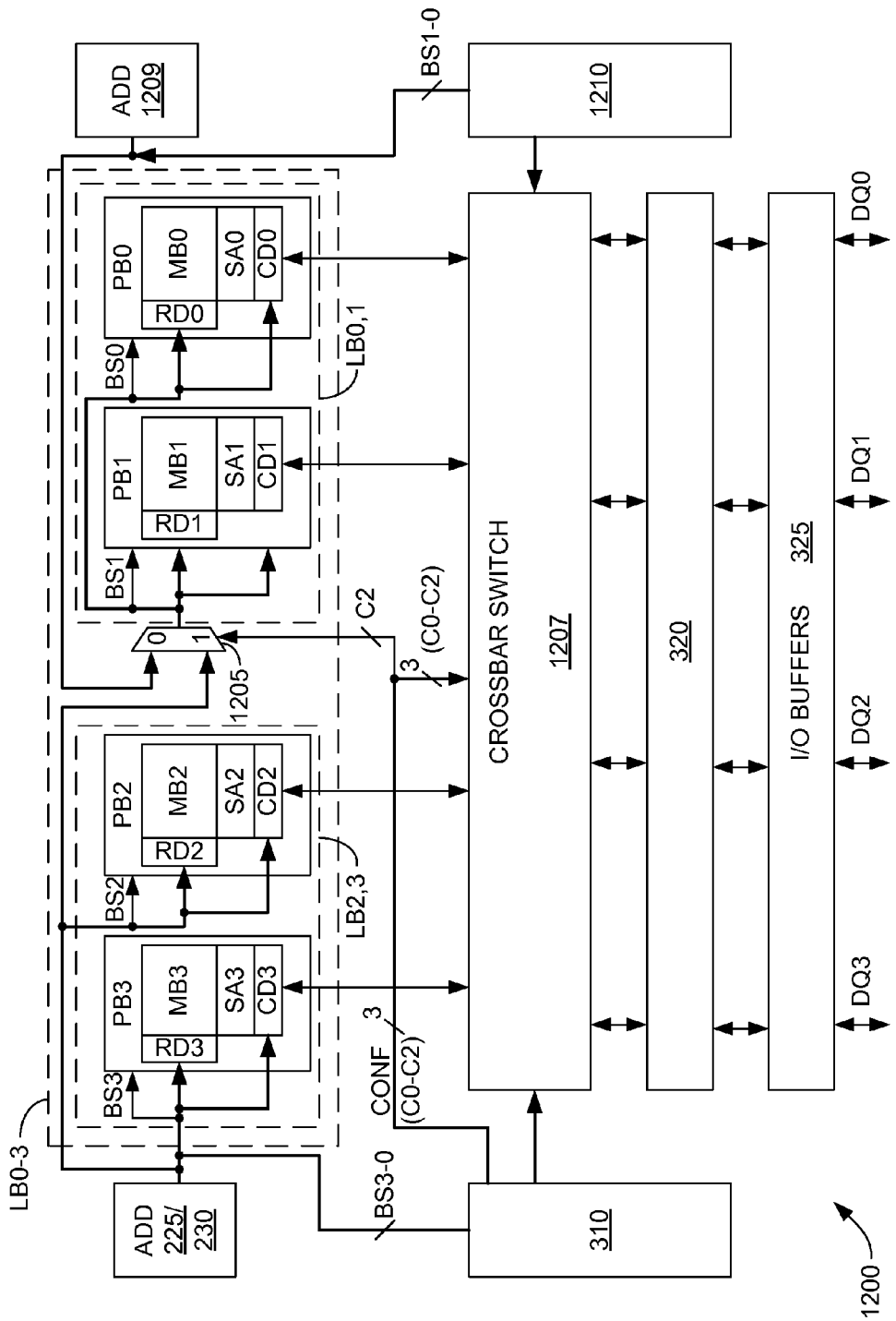
FIG. 12 depicts a specific implementation of a configurable core 1200 and associated circuitry.

FIG. 12 depicts a specific implementation of a configurable core 1200 and associated circuitry, the combination of which may be integrated to form a memory component. Core 1200 is similar to core 450 of FIG. 4B, like-named elements being the same. Core 1200 provides the same functionality as core 450, but the configuration and switching logic is modified to afford users the ability to partition the four physical banks PB0-PB3 into two separately addressable memories, each of which can be either one or two bits wide. Some elements are omitted from the depiction of FIG. 12 for brevity. For example, core 1200 may also include registers 405 and 410.

Physical bank PB0 includes a row decoder RD0, a memory array MA0, a sense amp SA0 (actually a collection of sense amplifiers), and a column decoder CD0. Each of the remaining physical banks PB1-PB3 includes identical structures. The row decoders, memory banks, sense amps, and column decoders are omitted from FIG. 4B for brevity, but are included in FIG. 12 to illustrate an addressing scheme that enables core 1200 to independently access logical blocks LB0,1 and LB2,3.

Address buffers 225 and 230, introduced in FIG. 3, connect directly to the row and column decoders of physical banks PB2 and PB3. Configuration logic 310, also introduced in FIG. 3, connects to the bank-select terminals BS3-0 and to a crossbar switch 1207. Address buffers 225 and 230 are also selectively connected to the row and column decoders in physical banks PB0 and PB1 via a multiplexer 1205.

The configuration and switching logic of core 1200 is extended to include a second set of address buffers (row and column) 1209 and a second set of configuration logic 1210. Address buffers 1209 connect to the row and column decoders in physical banks PB0 and PB1 via multiplexer 1205. Configuration logic 1210 connects to crossbar switch 1207—the data control circuit in this embodiment—and to bank-select terminals BS0 and BS1 via multiplexer 1205. A configuration-select bus CONF from configuration logic 310 includes three control lines C0-C2 that connect to crossbar switch 1207. Line C2 additionally connects to the select terminal of multiplexer 1205. In this embodiment, mode register 220 (FIG. 3) is adapted to store configuration data establishing the levels provided on lines C0-C2.

Core 1200 supports four operational modes, or "configurations," in addition to those described above in connection with FIGS. 3, 4A, and 4B. These modes are summarized below in Table 3.

TABLE 3

| CONF# | CORE CONFIGURATION | C2 | C1 | C0 |
|---|---|---|---|---|
| 1 | Single Address, Variable Width | 1 | X | X |
| 2 | Separate Addresses, separate 2-bit busses (DQ3/DQ2 and DQ1/DQ0) | 0 | 0 | 0 |
| 3 | Separate Addresses, memories share lines DQ1 and DQ0 | 0 | 0 | 1 |
| 4 | Separate Addresses, memories share lines DQ3 and DQ2 | 0 | 1 | 0 |
| 5 | Separate Addresses, banks configured to be 1-bit wide, data on lines DQ0 and DQ1 | 0 | 1 | 1 |

Core 1200 is operationally identical to core 450 of FIG. 4B if each of lines C0-C2 is set to logic one. In that case, the logic one on line C2 causes multiplexer 1205 to pass the address from address buffers 225 and 230 to physical banks PB0 and PB1. The logic levels on lines C0 and C1 are irrelevant in this configuration.

Driving line C2 to a voltage level representative of a logic zero causes multiplexer 1205 to convey the contents of the second set of address buffers 1209 to physical banks PB0 and PB1, and additionally causes crossbar switch 1207 to respond to the control signals on lines C0 and C1. Logical banks LB0,1 and LB2,3 are thereby separated to provide independent memory access. Logical banks LB0,1 and LB2,3 are separately addressable in each of configurations two through five of Table 3. Though not shown, logical banks LB0,1 and LB2,3 can be adapted to receive either the same clock signal or separate clock signals.

In configuration number two, crossbar switch 1207 accesses logical bank LB0,1 on lines DQ0 and DQ1 and logical bank LB2,3 on lines DQ2 and DQ3. Core 1200 is therefore divided into a pair of two-bit memories accessed via separate two-bit data busses.

In configuration number three, crossbar switch 1207 alternatively accesses either logical bank LB0,1 or logical bank LB2,3 via lines DQ0 and DQ1. Core 1200 is therefore divided into two separately addressable two-bit memories that share a two-bit data bus. Configuration number four is similar, but access is provided via lines DQ2 and DQ3.

Configuration number five divides core 1200 into two separately addressable, one-bit-wide memories. In effect, each pair of physical blocks within logical blocks LB0,1 and LB2,3 is combined to form a single-bit memory with twice the address locations of a parallel configuration. Each of the resulting one-bit-wide memories is then separately accessible via one bus line.

The modes of Table 3 are not exhaustive. More control signals and/or additional control logic can be included to increase the available memory configurations. For example, configuration number five might be extended to include the ability to select the bus line upon which data is made available, or the two-bit modes could be extended to provide data on additional pairs of bus lines.

The mode-select aspect allows core 1200 to efficiently support data of different word lengths. Processors, which receive instructions and data from memory like core 1200, are sometimes asked to alternatively perform complex sets of instructions on relatively small data structures or perform simple instructions on relatively large data structures. In graphics programs, for example, the computationally simple task of refreshing an image employs large data structures, while more complex image processing tasks (e.g., texture mapping and removing hidden features) often employ relatively small data structures. Core 1200 can dynamically switch between configurations to best support the task at hand by altering the contents of mode register 220 (FIG. 3). In the graphics-program example, instructions that contend with relatively large data structures might simultaneously access both logical blocks LB0,1 and LB2,3 in parallel, and instructions that contend with relatively small data structures might access logical blocks LB0,1 and LB2,3 separately using separate addresses. Core 1200 may therefore provide more efficient memory usage. As with cores 400 and 450, core 1200 minimizes the power required to perform a row access by limiting each row access to the selected physical bank(s).

Figure 13A:
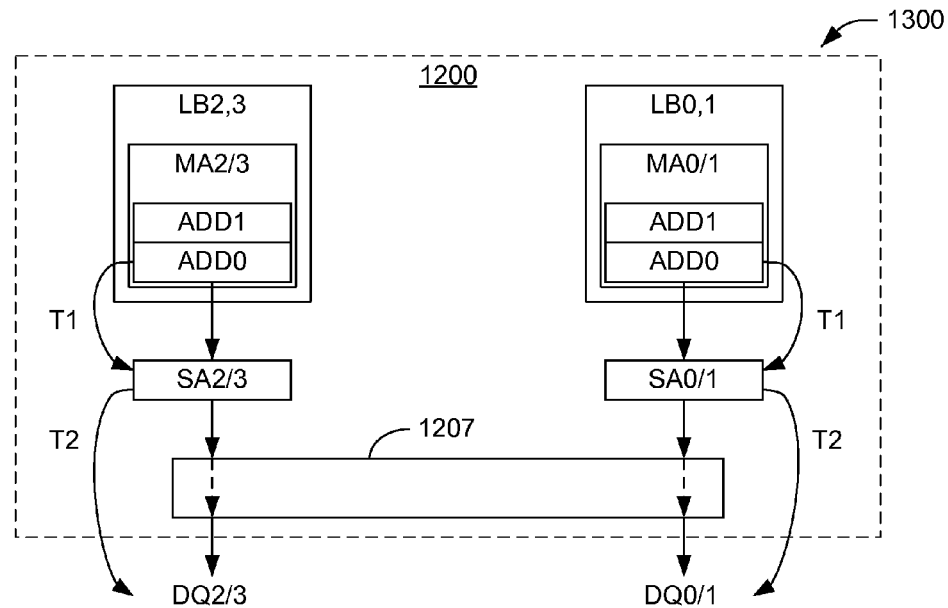
FIGS. 13A-F are simplified block diagrams of core 1200 of FIG. 12 illustrating access timing in a number of memory-access configurations.

FIG. 13A is a simplified block diagram 1300 of core 1200 of FIG. 12 illustrating memory access timing in one memory-access mode. In this example, core 1200 is configured to deliver full-width data from combined logical blocks LB2,3 and LB0,1. The pairs of memory blocks within each logical block LB2,3 and LB0,1 are combined for simplicity of illustration. At time T1, the data stored in row address location ADD in each of logical blocks LB2,3 and LB0,1 are each loaded simultaneously into respective sense amplifiers SA2/3 and SA0/1. The row address ADD used for each logical block is the same. Then, at time T2, the contents at the same column address of the two sense amplifiers are accessed simultaneously with data lines DQ3/2 and DQ1/0 via switch 1207. Time T1 precedes time T2.

Figure 13B:
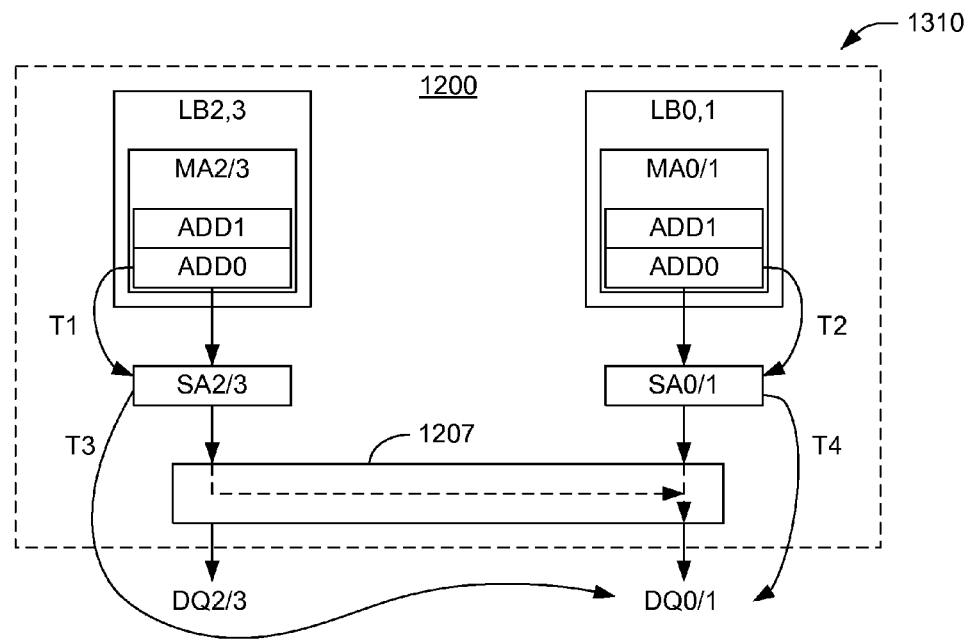

FIG. 13B is a block diagram 1310 of core 1200 of FIG. 12 illustrating access timing in a second memory-access mode. In this example, core 1200 is configured to alternatively deliver half-width data by separately accessing logical blocks LB2,3 and LB0,1. At time T1, the contents of row address ADD0 in logical block LB2,3 loads into sense amplifiers SA2/3. At another time T2 (where T2 may be earlier or later than T1), the contents of row address ADD0 in local block LB0/1 loads into sense amplifiers SA0/1. Of interest, at each of times T1 and T2 only the accessed physical blocks are enabled using the appropriate bank-select signals BS3-0 (see FIG. 12). The content at a column address of sense amplifiers SA2/3 is accessed at time T3 via the data lines DQ0/1. The content at the same column address of sense amplifiers SA0/1 is accessed at another time T4 via the data lines DQ0/1 (where T4 may be earlier or later than T3). Time T1 precedes time T3, and time T2 precedes T4.

Figure 13C:
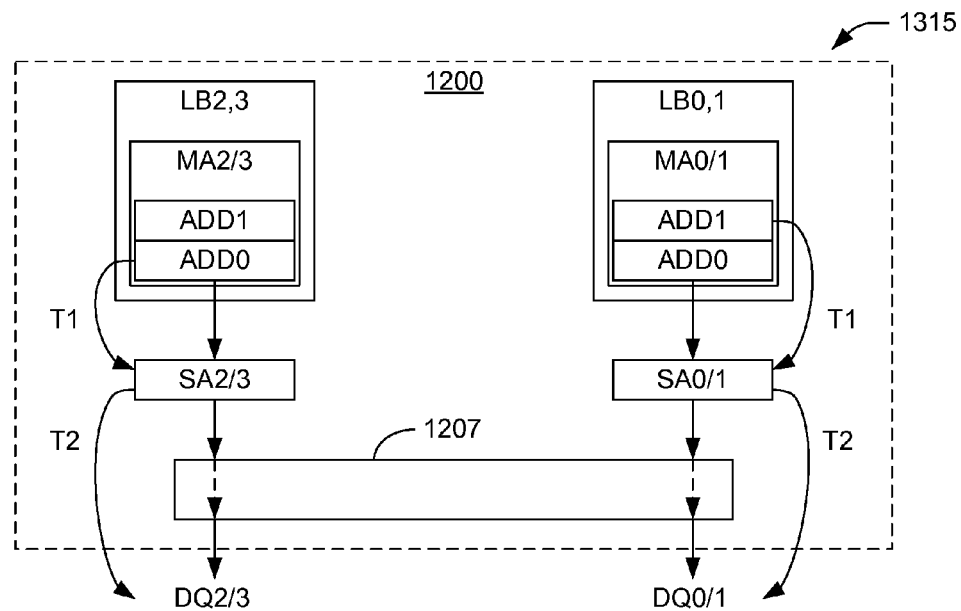

FIG. 13C is a simplified block diagram 1315 of core 1200 of FIG. 12 illustrating access timing in a third memory-access configuration. As in the example of FIG. 13A, core 1200 is configured to deliver full-width data from combined logical blocks LB2,3 and LB0,1; unlike the example of FIG. 13A, however, diagram 1315 illustrates the case in which logical blocks LB2,3 and LB0,1 are addressed separately. At time T1, the contents of row address ADD0 in logical block LB2,3 and row address ADD1 in logical block LB0,1 are loaded substantially simultaneously into respective sense amplifiers SA2/3 and SA0/1. The term "substantially simultaneous" is used here to indicate the possibility that these two operations are not precisely simultaneous (coincident), but nevertheless overlap. The content at a first column address of sense amplifiers SA2/3 is accessed at time T2 via the data lines DQ0/1. The content at a second column address of sense amplifiers SA0/1 is accessed substantially simultaneously at time T2 via the data lines DQ0/1. Time T1 precedes time T2.

Figure 13D:
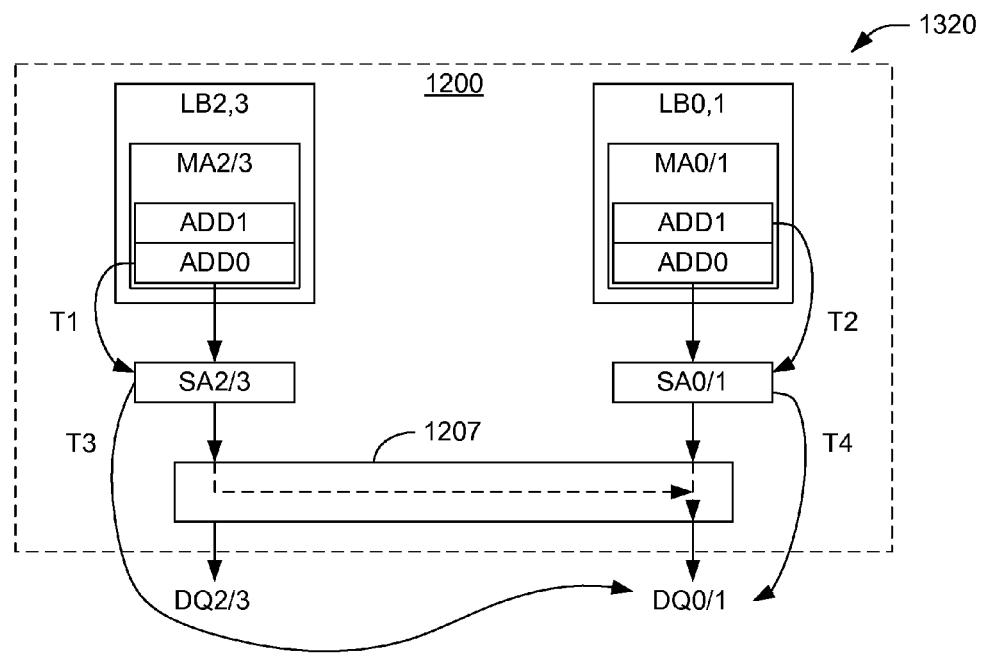

FIG. 13D is a block diagram 1320 of core 1200 of FIG. 12 illustrating access timing in a fourth memory-access mode. With respect to timing, diagram 1320 is similar to diagram 1310 of FIG. 13B. Diagram 1320 differs from diagram 1310, however, in that each of logical blocks LB2,3 and LB0,1 is independently addressed. Core 1200 can therefore interleave data from different addresses in logical banks LB2,3 and LB0,1 and provide the resulting data on data lines DQ1 and DQ0. Specifically, at time T1, the contents of row address ADD0 in logical block LB2,3 loads into sense amplifiers SA2/3. At another time T2 (where T2 may be earlier or later or the same as T1), the contents of another row address ADD1 in logical block LB0,1 loads into sense amplifiers SA0/1 (ADD0 and ADD1 may be the same or different). The content at a first column address of sense amplifiers SA2/3 is accessed at time T3 via the data lines DQ0/1. The content at a second column address of sense amplifiers SA0/1 is accessed at another time T4 via the data lines DQ0/1 (where T4 may be earlier or later than T3). Time T1 precedes time T3, and time T2 precedes T4.

Figure 13E:
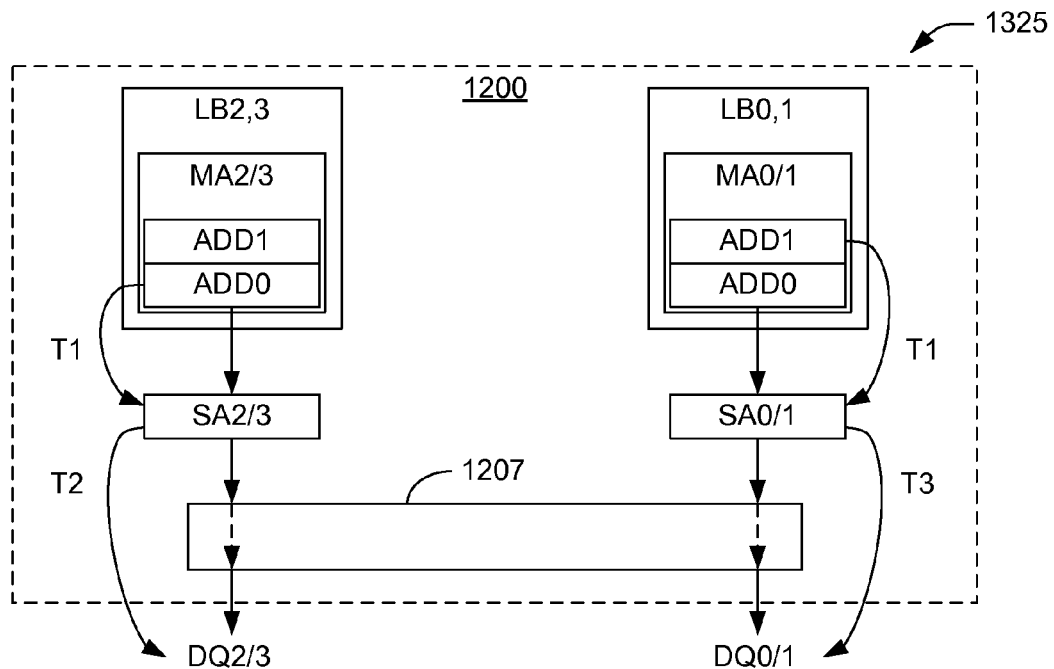

FIG. 13E is a simplified block diagram 1325 of core 1200 illustrating access timing in a mode that delivers full-width data from combined logical blocks LB2,3 and LB0,1. With respect to timing, diagram 1325 is similar to diagram 1300 of FIG. 13A. Diagram 1325 differs from diagram 1300, however, in that each of logical blocks LB2,3 and LB0,1 is independently addressed.

Figure 13F:
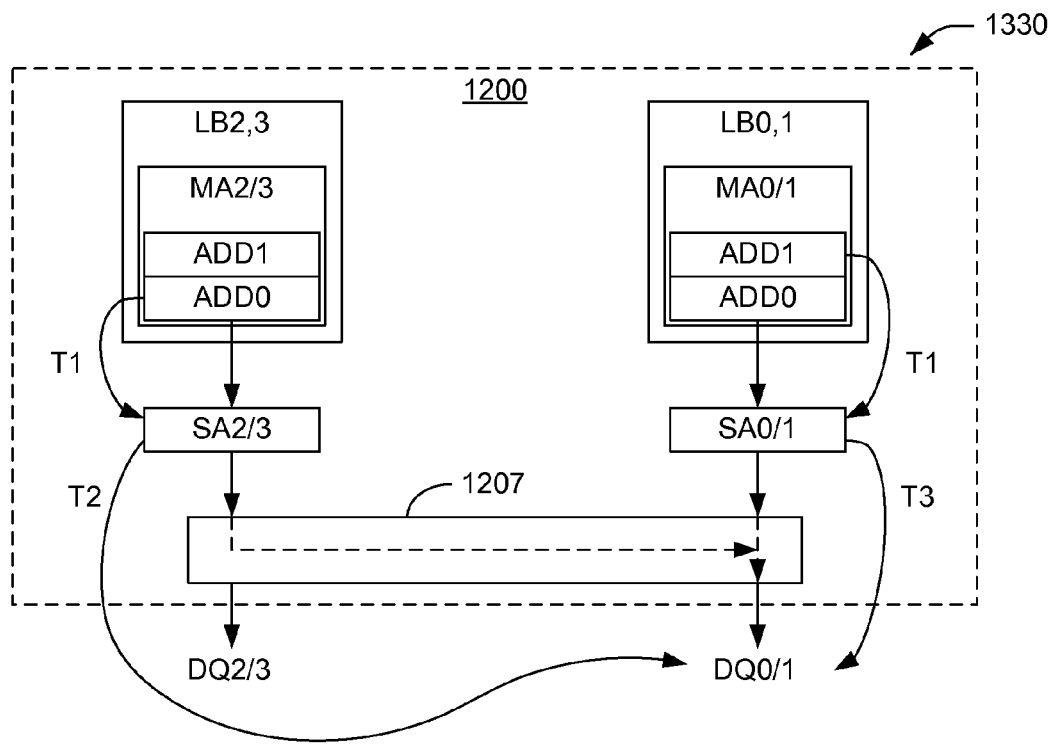

FIG. 13F is a simplified block diagram 1330 of core 1200 illustrating access timing in a mode that delivers half-width data from independently addressed logical blocks LB2,3 and LB0,1. The flow of data in diagram 1330 is similar to that of diagram 1320 of FIG. 13D. However, diagram 1330 differs from diagram 1320 with respect to timing because the contents of address locations ADD0 of logical block LB2,3 and ADD1 of logical block LB0,1 are delivered to respective sense amplifiers SA2/3 and SA0/1 substantially simultaneously.

Although details of specific implementations and embodiments are described above, such details are intended to satisfy statutory disclosure obligations rather than to limit the scope of the following claims. Thus, the invention as defined by the claims is not limited to the specific features described above. Rather, the invention is claimed in any of its forms or modifications that fall within the proper scope of the appended claims, appropriately interpreted in accordance with the doctrine of equivalents.

What is claimed is:

1. A memory apparatus comprising:
   an input to receive width selection information;
   an interface to exchange data with a remote device;
   a plurality of memory subsections, each subsection including columns of memory cells coupled to corresponding sense amplifiers; and
   routing coupling the memory subsections with the interface, the routing supporting first and second width configurations responsive to the width selection information;
   wherein
   in the first width configuration, the routing conveys data of a first data width between a first integer number of the memory subsections and the interface, and the plurality of memory subsections collectively provide a first memory depth, and
   in the second width configuration, the routing conveys data of a second data width between a second integer number of the memory subsections and the interface, and the plurality of memory subsections collectively provide a second memory depth;
   wherein the memory apparatus loads the sense amplifiers in the first number of the memory subsections for read operations in the first width configuration and loads the sense amplifiers in the second number of memory subsections for read operations in the second width configuration.

2. The memory apparatus of claim 1, further comprising:
   a command interface to receive memory commands, the memory commands including address information;
   decode logic to receive and to decode the address information and the width selection information, to produce decoded information; and
   routing control logic coupled between the decode logic and the routing, the routing control logic to convey the decoded information to the routing.

3. The memory apparatus of claim 2, wherein the routing selects the first integer number or the second integer number responsive to the width selection information.

4. The memory apparatus of claim 1, wherein each memory subsection comprises a physical memory bank and the first and second integer numbers of the memory subsections respectively comprise a first logical bank and a second logical bank.

5. The memory apparatus of claim 1, wherein the first integer number is one.

6. The memory apparatus of claim 1, wherein the routing comprises a cross-bar switch.

7. The memory apparatus of claim 1, wherein the first number of the memory subsections has a first subsection width, the second number of the memory subsections has a second subsection width, and the ratio of the first data width to the first subsection width equals the ratio of the second data width to the second subsection width.

8. The memory apparatus of claim 1, embodied as a memory module.

9. The memory apparatus of claim 1, embodied as a computer motherboard.

10. The memory apparatus of claim 1, wherein the plurality of memory subsections collectively forms a reconfigurable memory core of a discrete integrated circuit device.

11. The memory apparatus of claim 1, wherein:
    the memory apparatus further comprises first and second data lines;
    in the first width configuration, data is conveyed on the first and the second data lines; and in the second width configuration, data is conveyed on the first data line but not the second data line.

12. The memory apparatus of claim 11, wherein:
the memory apparatus further comprises first and second data pins;
the memory apparatus further comprises a crossbar switch coupling the first and second data pins with the first data line; and
the crossbar switch is to couple the first data line with a selective one of the first data pin or the second data pin.

13. The memory apparatus of claim 12, embodied as a dynamic random access memory device.

14. The memory apparatus of claim 1, wherein:
the routing coupling the memory subsections with the interface additionally supports a third width configuration responsive to the selection information; and
in the third width configuration, the routing conveys data of a third data width between a third integer number of the memory subsections and the interface, and the plurality of memory subsections collectively provides a third memory depth.

15. The memory apparatus of claim 14, wherein:
the routing coupling the memory subsections with the interface additionally supports a fourth width configuration responsive to the selection information; and
in the fourth width configuration, the routing conveys data of a fourth data width between a fourth integer number of the memory subsections and the interface, and the plurality of memory subsections collectively provide a fourth memory depth.

16. The memory apparatus of claim 14, wherein each memory subsection is a physical memory bank, and wherein the first width configuration includes four logical banks, the second width configuration includes two logical banks, and the third width configuration includes one logical bank.

17. A memory controller, comprising:
an output to send width selection information to at least one variable-width memory;
a data interface having a width N for exchanging data with the at least one variable-width memory in a point-to-point configuration;
wherein
when the controller exchanges data with only a first variable-width memory, the width selection information comprises a memory width of N; and
when the controller exchanges data with the first variable-width memory and a second variable-width memory, the width selection information comprises a memory width of N/2.

18. The memory controller of claim 17, wherein the width selection information is halved when the memory controller senses the number of variable-width memories doubling.

19. The memory controller of claim 18, further comprising:
circuitry to alter the width selection information in response to changes in the number of variable-width memories.

20. The memory controller of claim 17, further comprising:
circuitry to detect the number of variable-width memories with which the memory controller exchanges data.

* * * * *